(12) United States Patent
Jain

(10) Patent No.: US 9,006,931 B2
(45) Date of Patent: Apr. 14, 2015

(54) STATIC-ELECTRICAL-FIELD-ENHANCED SEMICONDUCTOR-BASED DEVICES AND METHODS OF ENHANCING SEMICONDUCTOR-BASED DEVICE PERFORMANCE

(75) Inventor: Ajaykumar R. Jain, San Carlos, CA (US)

(73) Assignee: Versatilis LLC, Shelburne, VT (US)

( * ) Notice: Subject to any disclaimer, the term of this patent is extended or adjusted under 35 U.S.C. 154(b) by 315 days.

(21) Appl. No.: 13/510,427

(22) PCT Filed: Dec. 1, 2010

(86) PCT No.: PCT/US2010/058539
§ 371 (c)(1),
(2), (4) Date: May 17, 2012

(87) PCT Pub. No.: WO2011/068857
PCT Pub. Date: Jun. 9, 2011

(65) Prior Publication Data
US 2013/0056712 A1    Mar. 7, 2013

Related U.S. Application Data

(60) Provisional application No. 61/283,265, filed on Dec. 2, 2009, provisional application No. 61/283,356, filed (Continued)

(51) Int. Cl.
*C23C 16/44* (2006.01)
*H01L 31/0216* (2014.01)

(Continued)

(52) U.S. Cl.
CPC .......... *H01L 31/02167* (2013.01); *H01L 31/06* (2013.01); *H01L 51/42* (2013.01); *Y02E 10/549* (2013.01)

(58) Field of Classification Search
USPC ........ 427/96.3, 97.1, 97.4, 98.4, 99.2; 307/82
See application file for complete search history.

(56) References Cited

U.S. PATENT DOCUMENTS 7,157,641 B2     1/2007   Gregg
2008/0157128 A1*  7/2008   Katz et al. ..................... 257/215

FOREIGN PATENT DOCUMENTS

JP        58098987 A  *  6/1983
JP        04127581 A  *  4/1992
(Continued)

OTHER PUBLICATIONS

International Search Report dated Aug. 10, 2011, in connection with related PCT/US10/58539, filed Dec. 1, 2010.

(Continued)

*Primary Examiner* — Thomas L Dickey
(74) *Attorney, Agent, or Firm* — Downs Rachlin Martin PLLC

(57) ABSTRACT

Devices that include one or more functional semiconductor elements that are immersed in static electric fields (E-fields). In one embodiment, one or more electrets are placed proximate the one or more organic, inorganic, or hybrid semiconductor elements so that the static charge(s) of the electret(s) participate in creating the static E-field(s) that influences the semiconductor element(s). An externally applied electric field can be used, for example, to enhance charge-carrier mobility in the semiconductor element and/or to vary the width of the depletion region in the semiconductor material.

39 Claims, 14 Drawing Sheets

Related U.S. Application Data on Dec. 3, 2009, provisional application No. 61/343,932, filed on May 6, 2010, provisional application No. 61/343,931, filed on May 6, 2010, provisional application No. 61/396,020, filed on May 21, 2010, provisional application No. 61/396,022, filed on May 21, 2010.

(51) Int. Cl.
*H01L 31/06* (2012.01)
*H01L 51/42* (2006.01)

(56) References Cited

FOREIGN PATENT DOCUMENTS

| KR | 10-0866632 B1 | 11/2008 |
| KR | 10-2009-0119141 A | 11/2009 |

OTHER PUBLICATIONS

Written Opinion dated Aug. 10, 2011, in connection with related PCT/US10/58539, filed Dec. 1, 2010.

\* cited by examiner

Prior Art

US 9,006,931 B2

STATIC-ELECTRICAL-FIELD-ENHANCED SEMICONDUCTOR-BASED DEVICES AND METHODS OF ENHANCING SEMICONDUCTOR-BASED DEVICE PERFORMANCE

RELATED APPLICATION DATA

This application claims the benefit of priority of the following U.S. Provisional Patent Applications, each of which is incorporated by reference herein in its entirety: U.S. Provisional Application Ser. No. 61/283,265, filed on Dec. 2, 2009; U.S. Provisional Application Ser. No. 61/283,356, filed on Dec. 3, 2009; U.S. Provisional Application Ser. No. 61/343,932, filed on May 6, 2010; U.S. Provisional Application Ser. No. 61/343,931, filed on May 6, 2010; U.S. Provisional Application Ser. No. 61/396,020, filed on May 21, 2010; and U.S. Provisional Application Ser. No. 61/396,022, filed on May 21, 2010.

FIELD OF THE INVENTION

The present invention generally relates to the field of semiconductor-based devices. In particular, the present invention is directed to static-electrical-field-enhanced semiconductor-based devices and methods of enhancing semiconductor-based device performance.

BACKGROUND

Trends in semiconductor-based electronics industries suggest that future displays, solar cells, and electronic products will be made on flexible/conformal substrates. This transition is seen as inevitable to service the ever-present need and desire to reduce the size, weight, and cost of the products we use without sacrificing their performance. A wide gamut of devices, from displays, electronics, solar cells, and sensors, to name a few, would benefit from methodologies that result in the mass production of ruggedized, light weight, portable, small form factor, less power hungry, and lower cost products. Furthermore, new and novel markets and opportunities could be addressed and opened up if these devices could be made flexible and/or conformal.

Future generation semiconductor technologies for flexible/conformal substrates will most likely utilize organic semiconductors, rather than the inorganic semiconductors that have largely dominated semiconductor device manufacturing into at least the early 2000s. Organic semiconductors typically require much lower processing temperatures than inorganic semiconductors, allowing them to be used with flexible substrates that cannot withstand the high-temperature processes used for inorganic materials. Inorganic semiconductors can be processed at lower temperatures. However, low temperature deposition of inorganic semiconductors used in industry typically yields amorphous and polycrystalline phases of the semiconductor, and these phases tend to have significantly lower carrier mobilities than can be realized in single-crystal variants of the same semiconductor.

For example, hydrogenated amorphous silicon is a ubiquitous material used in the liquid crystal display (LCD) industry and the emerging solar cell industry. However, electron carrier mobility in hydrogenated amorphous silicon is typically in the range of 0.3 $cm^2/Vs$ to 1.2 $cm^2/Vs$, depending on deposition conditions. Amorphous silicon can be re-crystallized, post deposition, using a technique called "solid-phase crystallization." The resulting nano- and micro-grained polycrystalline material might have mobilities between 10 $cm^2/Vs$ to 250 $cm^2/Vs$. However, this is still significantly below single crystal silicon mobilities of >450 $cm^2/Vs$. A similar pattern of deteriorating electrical performance is found in most semiconductors as the material goes from the single-crystal to the poly-crystal to the amorphous phase.

The performance of some p-n-junction-based devices, such as solar cells, is based in part on the width of the depletion region within the device. For example, for an ideal solar cell, higher performance at longer wavelengths requires the width of the depletion region to be as wide as possible in order to obtain high photocurrent. This is due to the fact that typically the absorption coefficients of semiconductors are lower at higher wavelengths when compared to lower wavelengths. A wider depletion region can be achieved by reducing the dopant concentration. However, lower doping reduces the open-circuit voltage, Voc, of the solar cell. At lower wavelengths, the absorption coefficients tend to be high, and, therefore, the width of the depletion region must be made as small as possible so that the photons will be absorbed near the junction. However, a smaller depletion region will increase unwanted surface recombination thus the series resistance will increase. Consequently, the solar cell's efficiency is reduced. This means the solar cell efficiency is limited by the device and design parameters.

SUMMARY OF THE DISCLOSURE

In one implementation, the present disclosure is directed to a device, including a functional semiconductor element providing, during use, at least one of 1) an electrical function and 2) an optoelectrical function; and an electric field source that produces a static electric field and includes at least one electret, the static-field source designed, configured and located in fixed relation relative to the functional semiconductor element so that the static electric field enhances carrier mobility within the functional semiconductor element.

In another implementation, the present disclosure is directed to a device, including a functional semiconductor element that includes a donor material, an acceptor material, and a carrier-depletion region formed within the donor and acceptor materials and having a width, the functional semiconductor element providing, during use, at least one of 1) an electrical function and 2) an optoelectrical function; and an electrical-field source that produces a static electric field, the electric field source located in fixed relation relative to the functional semiconductor element so as to control the width of the depletion region.

In still another implementation, the present disclosure is directed to a photovoltaic-cell device, including a photovoltaic cell that includes: a semiconductor body containing donor and acceptor materials and having a first side and a second side spaced from the first side; a first ohmic contact in electrical communication with the semiconductor body on the first side; a second ohmic contact in electrical communication with the semiconductor body on the second side; and an electrical-field source designed and configured to apply a static electric field across the semiconductor body, the electrical-field source including: a first electret located on the first side of the semiconductor body; and either 1) a second electret located on the second side of the semiconductor body or 2) a grounded body located on the second side of the semiconductor body; wherein each of the first and second ohmic contacts is designed and configured to allow the static electric field to be present across the semiconductor body.

In yet another implementation, the present disclosure is directed to a method of enhancing performance of a functional semiconductor element. The method includes providing the functional semiconductor element; and locating an electret-based electric field source proximate the functional semiconductor element so as to immerse the functional semiconductor element in a static electric field from the electret-based electric field source so as to enhance performance of the functional semiconductor element.

In still yet another implementation, the present disclosure is directed to a method of modulating the width of a depletion region in a functional semiconductor element. The method includes providing the functional semiconductor element having the depletion region straddling a junction between a p-type semiconductor material and an n-type semiconductor material; and immersing the functional semiconductor element in a static electric field for the purpose of modulating the width of the depletion region.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

One aspect of this disclosure addresses functional semiconductor elements that are performance enhanced using electrets that subject the elements to static electric fields (E-fields) during their functional operation. As used herein and in the appended claims, the term "functional semiconductor element" refers to an electrical or optoelectrical circuit element that provides a basic electrical or optoelectrical function when subjected to electrical and/or electromagnetic stimulation. Examples of electrical-type functional semiconductor elements include, but are not limited to, thin-film transistors, thick-film transistors, diodes, sensors, transducers, etc. Examples of optoelectrical-type functional semiconductor elements include, but are not limited to, photovoltaic cells, light-emitting diodes, lasers, and photodiodes and other detectors, whether they be in the visible spectral band or other spectral band, such as ultraviolet, x-ray, infrared, etc. Those skilled in the art will readily understand what the function of a particular functional semiconductor element is upon learning the descriptor of that element, for example, "photovoltaic cell," "solar cell," "field-effect transistor," etc. Further examples of other electrical and optoelectrical functional semiconductor elements appear on pages 24 and 25 of U.S. Provisional Patent Application No. 61/396,022, filed on May 21, 2010, and titled "NEW AND NOVEL METHOD TO INCREASE THE EFFICIENCY OF ELECTRONIC AND OPTO-ELECTRONIC DEVICES (I)" (hereinafter, "the '022 application"), and are incorporated by reference herein.

One benefit to subjecting functional semiconductor elements to such static E-fields is that the charge-carrier mobilities within the semiconductors of the elements are enhanced relative to the mobilities of the elements without the influence of the static E-fields. Another benefit of subjecting the elements to static E-fields is that the widths of the depletion regions associated with the junctions between donor and acceptor materials within the elements can be controlled, i.e., modulated by suitable selection of the magnitudes and directions of the static E-fields. These and other benefits of the features of the present disclosure are described below in detail in connection with specific embodiments that those skilled in the art will readily be able to generalize using the basic features of the present disclosure.

Figure 1A:
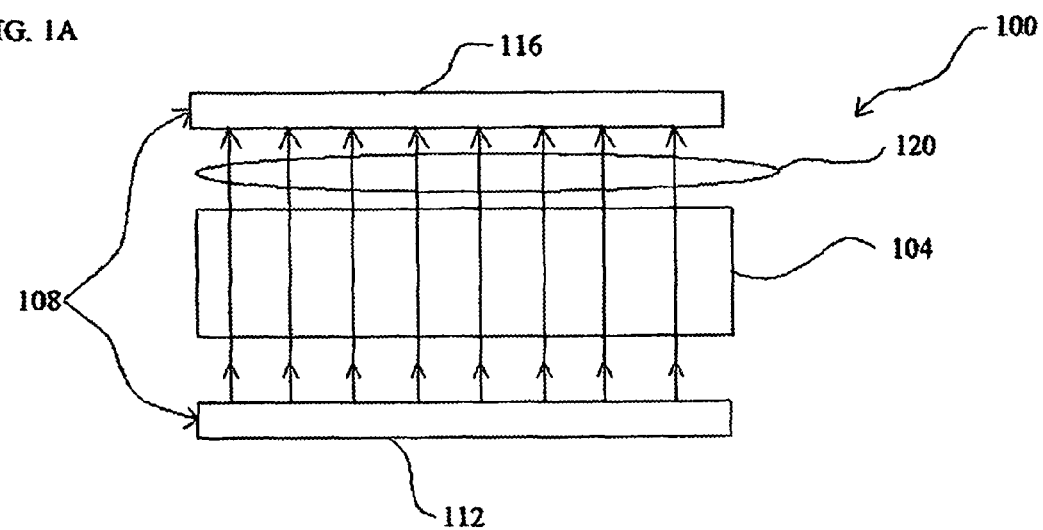
FIG. 1A is a schematic diagram of a semiconductor-based device having an electret-based electric field (E-field) source immersing functional semiconductor elements in a static E-field.
Figure 1B:
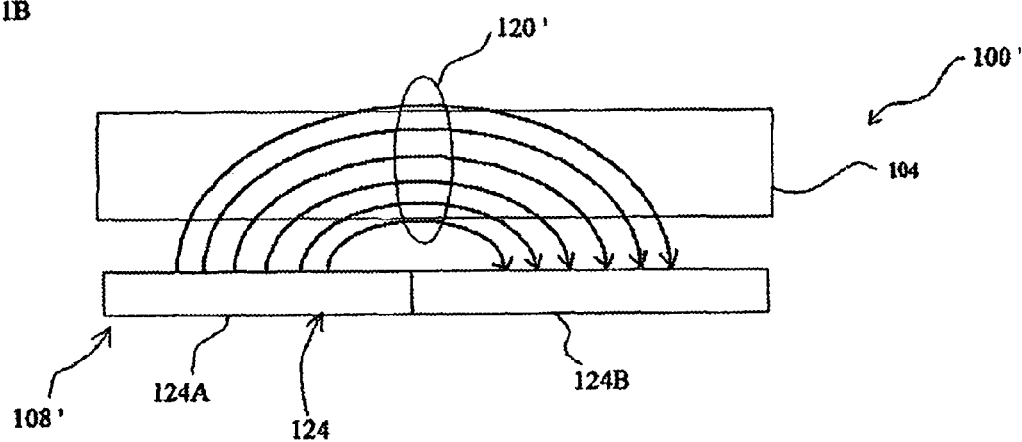
FIG. 1B is a schematic diagram of another semiconductor device having an alternative electret-based E-field source immersing functional semiconductor elements in a static E-field.

Referring now to FIGS. 1A and 1B, which illustrate two different semiconductor-based devices 100, 100', respectively, a method of the present disclosure can be broadly described as including two meta-steps as follows. One or more functional semiconductor elements 104 are provided at one meta-step, and an electret-based E-field source 108, 108' that subjects the one or more functional semiconductor elements to a static E-field during functional operation of the element(s) is provided at the other meta-step. In FIG. 1A, E-field source 108 comprises first and second bodies 112, 116, with the first body being an electret and the second body being either an electret or a grounded body so as to produce a static E-field 120. Assuming that the electrical charge of first body 112 is more positive than the electrical charge of second body 116, static E-field 120 has the directionality shown in FIG. 1A. In this example, first body 112 is mono-polar, i.e., has an electrical charge of only one polarity. When second body 116 is an electret, it may also be mono-polar.

Typically, though not necessarily, when second body 116 is an electret, the polarity of the second body is opposite the polarity of first body 112. This is so because it is usually desirable to maximize the magnitude of static E-field 120, and providing electrets of opposite polarities is a convenient way to maximize this magnitude. It is noted that while mono-polar electrets 112, 116 are illustrated, the electrets provided may be multi-polar in which differing regions, for example, differing lateral regions, of the electrets have differing polarities. This example is illustrated in FIG. 1B, wherein electrical-field source 108' of device 100' consists essentially of a single electret 124 having lateral regions 124A, 124B of differing polarities, so as to cause static E-fields 120' shown. FIG. 1B illustrates the fact that an electret-based E-field source of the present disclosure does not necessarily have parts located on opposing sides of the one or more functional semiconductor elements. It is noted that first and second bodies 112, 116 (FIG. 1A) and electret 124 (FIG. 1B) are often either in sheet or layer form, but may be of another form.

As those skilled in the art will readily appreciate, each of the two meta-steps noted above are typically carried out by performing a number of fabrication steps, and these fabrication steps will depend on, among other things, the type of device being produced and the natures of the fabrication processing steps being used for a particular semiconductor-based device. Since the two meta-steps are applicable to inorganic and organic semiconductors and all processing and fabrication steps associated therewith, as well as to many varieties of electrets and electret formation techniques, those skilled in the art will also appreciate the vast variety and diversity of fabrication steps that can be performed under the two meta-steps.

Skilled artisans will further appreciate that in some embodiments at least some of the fabrication steps corresponding to one of the two meta-steps can be interleaved with at least some of the fabrication steps corresponding to the other meta-steps, but that in other embodiments all the fabrication steps of one of the two meta-steps can be performed before performing any of the fabrication steps of the other meta step. As an example, in some embodiments, all fabrication steps for the functional semiconductor element(s) are to be performed before any of the fabrication steps are performed for the electrical-field source. For instance, in one example a functioning solar cell is fabricated prior to being sandwiched between two electret layers. However, in other embodiments, some of the electret-fabrication steps are performed before the completion of the functional semiconductor elements. For instance, in one example an electret layer is deposited, but not charged, prior to forming the last layer(s) of the functional semiconductor element(s). Then, after the last layer(s) of the functional semiconductor element(s) is/are formed, the electret layer is completed by charging it. Those skilled in the art will recognize that the combinations and permutations of the actual fabrication steps needed to create a finished static-electrical-field enhanced device are far too numerous to describe herein. That said, skilled artisans will readily understand how to implement the meta-steps using any set of fabrication steps. With the foregoing in mind, following are some exemplary embodiments that are of particular current interest.

Figure 2:
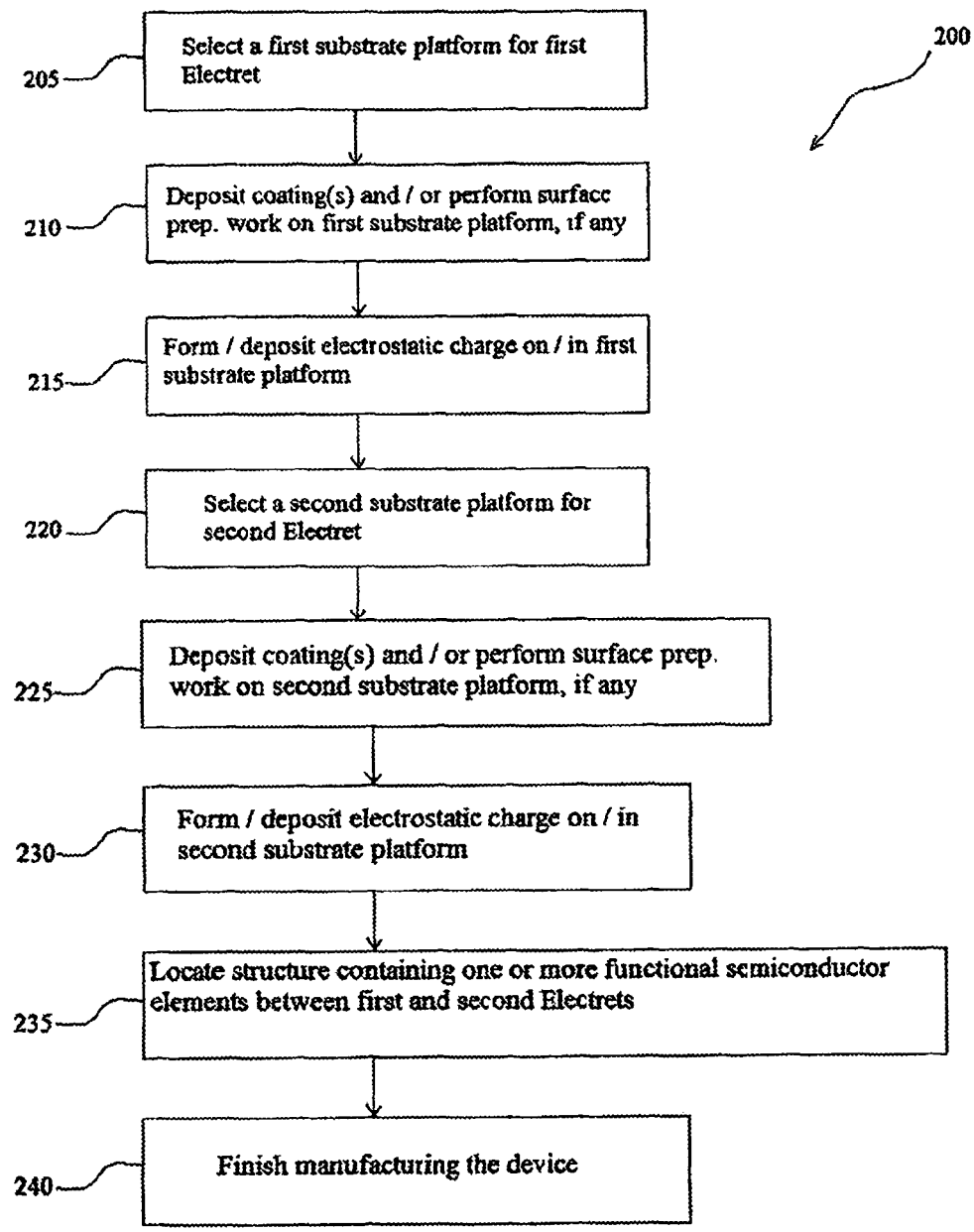
FIG. 2 is a flow diagram of an exemplary method of making a semiconductor device that includes an electret-based static-E-field source having components on both sides of a functional semiconductor element.

FIG. 2 illustrates an exemplary method 200 of making a semiconductor-based device that includes an E-field source having components on both sides of the functional semiconductor element(s), such as device 100 of FIG. 1A. In this example, it might be useful to analogize the two components of the E-field source to the charge plates of a conventional capacitor, with the functional semiconductor element(s) located between the two components taking the place of, at least in part, the dielectric of the capacitor. For convenience, some of the following examples are described using this "plate" terminology. However, those skilled in the art should understand that the "plates," or more generally structures, can be of any other form, such as sheets, layers, disks, or other bodies, that provide the appropriate functionality of contributing to subjecting the functional semiconductor element(s) to a static E-field. In addition, it is noted that while exemplary method 200 is described in terms of the plates being formed separately from the structure containing functional semiconductor element(s), those skilled in the art will appreciate that the plates can be formed integrally with that structure.

At step 205, an appropriate first substrate platform is selected on (or in) which a first electret will be formed. The first substrate platform is selected for the application at issue so as to have the desired properties (thickness, surface finish, transparency, stiffness, orientation, etc). The material of the first substrate platform can be chosen from the list of materials/chemical compositions outlined on pages 13-15 of the '022 application, that are incorporated herein by reference. This first substrate platform will be used to form one of the two plates of the capacitor-like structure of the E-field source.

At step 210, any necessary/desired coatings, if any, are deposited and/or any other surface preparation work, if any, is conducted on the first substrate platform. Pages 16-19 of the '022 application, incorporated herein by reference above, describe examples of coating and surface preparation work that can be performed at step 210.

At step 215, an electrostatic charge is deposited on and/or formed in the first substrate platform from step 205 (and/or in/on a coating if so deposited in step 210). Exemplary techniques for forming the charge, polarity, magnitude, etc., are outlined on pages 20-23 of the '022 application incorporated herein by reference above. This charge may be deposited over the entire surface of the first substrate platform or only one or more sub-regions of it, etc.

At step 220, an appropriate second substrate platform is selected on (or in) which a second electret will be formed. Like the first substrate platform, this second substrate platform is selected for the application at issue so as to have the desired properties (thickness, surface finish, transparency, stiffness, orientation, etc). The material for the second substrate platform can be chosen from the list of materials/chemical compositions outlined on pages 13-15 of the '022 application, that are incorporated herein by reference. This second substrate platform will be used to form the other of the two plates of the capacitor-like structure of the E-field source. In some architectures, as discussed below, the second substrate platform might be redundant and hence not be required/be optional.

At step 225, any necessary/desired coatings, if any, are deposited and/or any other surface preparation work is conducted on the second substrate platform. Pages 16-19 of the '022 application, incorporated herein by reference above, describe examples of coating and surface preparation work that can be performed at step 225.

At step 230 an electrostatic charge is deposited on and/or formed in the second substrate platform from step 220 (and/or in/on a coating if so deposited in step 225). Exemplary techniques for forming the charge, polarity, magnitude, etc., are outlined on pages 20-23 of the '022 application incorporated herein by reference above. This charge may be deposited over the entire surface of the second substrate platform or only one or more sub-regions of it, etc.

At step 235, the structure containing the functional semiconductor element(s) is located between the electrically charged plates of the capacitor structure from steps 215 and 230 to "immerse" the element(s) in the static E-field between the charged plates. At step 240, the manufacturing steps are concluded and the finished devices/device coatings are sent further along the fabrication line, as desired, for additional functionality creation, integration with other components, inspection, packaging, etc. It is noted that although method 200 details constructing the appropriate electret plates ex-situ and then subsequently locating the structure containing the semiconductor element(s) between the plates, it will be understood that in some cases the electret plates could be directly made on top (and/or bottom) of such structure in-situ. Examples of functional electrical and opto-electrical elements that can be made using a method of the present disclosure, such as method 200, are listed on pages 25-26 of the '022 application, under the section titled "Semiconductor Devices," and are incorporated herein by reference.

As those skilled in the art will readily appreciate, the electrically charged structure(s) of the E-field source can be located relative to the structure(s) containing the functional semiconductor element(s) in any of a variety of arrangements and can be electrically charged in a number of ways. FIGS. 3-6 illustrate some representative variations, which are not intended to be limiting in any way.

Figure 3:
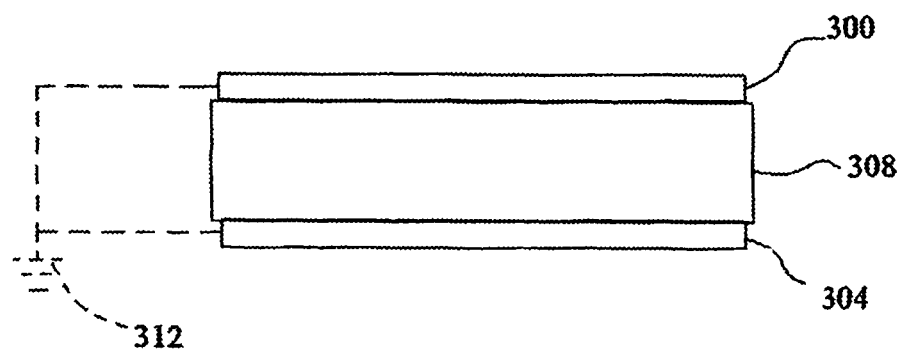
FIG. 3 is a schematic diagram illustrating an arrangement for a semiconductor device in which the charged structures of the static-E-field source are in intimate contact with the structure containing the functional semiconductor element(s)

FIG. 3 illustrates an arrangement in which a pair of electrically charged plates 300, 304, or charged coatings, are in intimate contact with a functional-semiconductor-element-containing structure 308 that is subjected to the static E-field present between the charged plates. Such an arrangement can be made, for example, by directly depositing/creating electrets on the semiconductor structure 308, or laminating secondary sheets containing the electrets on/in them on top of the semiconductor structure. Alternatively, one or the other of plates 300, 304 could be electrically coupled to a ground 312 and still provide the static E-field (not shown) between the plates.

Figure 4:
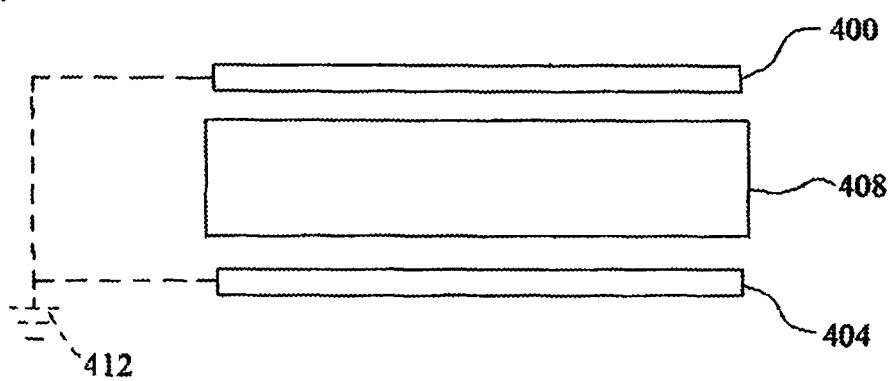
FIG. 4 is a schematic diagram illustrating an arrangement for a semiconductor device in which the charged structures of the static-E-field source are not in intimate contact with the structure containing the functional semiconductor element(s)

FIG. 4 illustrates another arrangement in which a pair of electrically charged plates 400, 404, or charged coatings, are not located in intimate contact with the corresponding functional-semiconductor-element-containing structure 408. Alternative embodiments could have one or the other of plates 400, 404 electrically coupled to a ground 412 and still provide the static E-field (not shown) between the plates.

Figure 5:
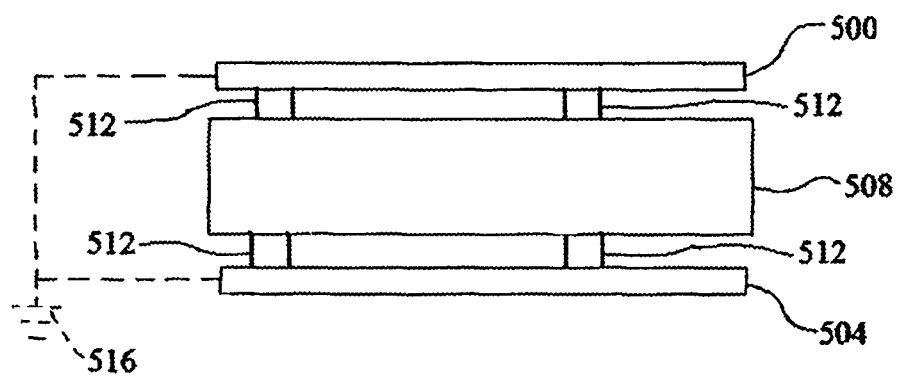
FIG. 5 is a schematic diagram illustrating an arrangement for a semiconductor device in which the charged structures of the static-E-field source are spaced from the structure containing the functional semiconductor element(s) by spacers.

Relatedly, FIG. 5 shows yet another arrangement in which the pair of electrically charged plates 500, 504, or charged coatings, are not in intimate contact with the functional-semiconductor-element-containing structure 508 and are spaced therefrom by spacers 512 selected to maintain/regulate standoff distances between the functional-semiconductor-element-containing structure and each of the charged plates. Similar to other alternative embodiments, one or the other of plates 500, 504 can be electrically coupled to a ground 516 and still provide the static E-field (not shown) between the plates.

Figure 6:
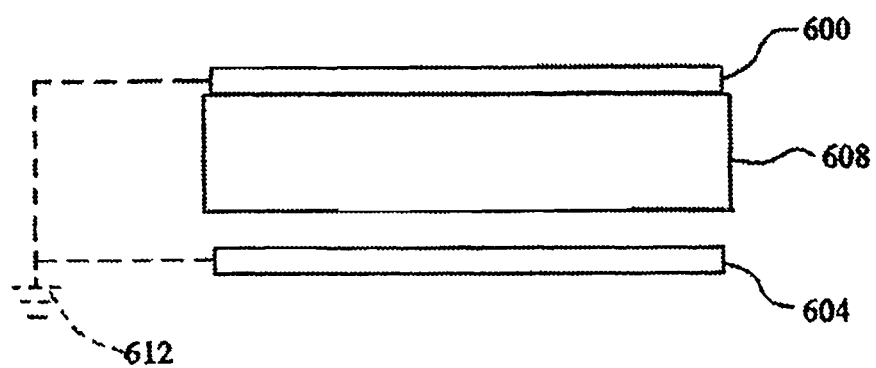
FIG. 6 is a schematic diagram illustrating an arrangement for a semiconductor device in which one of the charged structures of the static-E-field source is in intimate contact with the structure containing the functional semiconductor element(s) and the other is not.

FIG. 6 shows still another arrangement having two charged plates 600, 604 in which one charged plate (600) is in intimate contact with functional-semiconductor-element-containing structure 608 and the other charged plate (604) is not in intimate contact with that structure. Here, too, one or the other of plates 600, 604 can be electrically coupled to a ground 612 and still provide the static E-field (not shown) between the plates.

Regarding the effective polarity of the charged plates and the magnitudes of the effective charge, these can be any polarity and magnitude that provide the desired static E-field within the corresponding functional-semiconductor-element-containing structure. It is noted that the term "effective polarity" is used herein to refer to the polarity that contributes to the static E-field across the functional-semiconductor-element-containing structure.

As specific examples, and using the arrangement of FIG. 3 to represent a general condition, in some embodiments both plates 300, 304 can have the same effective polarity as one another, either both all positive or both all negative. In other embodiments, plates 300, 304 can have opposite effective polarities, i.e., one has all negative effective charges and the other has all positive effective charges. In both of these examples, each plate can be said to be "mono-polar" in terms of their effective polarities, even though, overall, that plate might be considered bipolar because of the differing polarities on the two sides. As for bipolar electrets that can be used to provide the static E-fields of the present disclosure, examples of these are shown on pages 31-33 of the '022 application. As those skilled in the art will appreciate, other bipolar arrangements can be made.

As for the electrets themselves, they can have any of a variety of configurations and properties. Further regarding their charge, a sheet- or plate-type electret can be charged, for example, on one or both surfaces, only in bulk, or in bulk and on one or both surfaces. Similarly, layer-type electrets can be bulk-charged, surface changed, or both. An electret can be a single layer or a multilayer composite, such as an oxide-nitride-oxide stack or an oxide-nitride-oxide-nitride-oxide stack. In addition to bulk materials, an electret can be composed of quantum dots, nanocrystal traps, etc. An electret can be transparent to one or more particular portions of the electromagnetic spectrum, such as ultraviolet, infrared, far infrared, etc., or an electret can be opaque as needed/desired to suit a particular application.

During fabrication, the assemblage of the semiconductor-based structure and the static electric field source can be packaged in a particular ambient environment as desired to increase the charge lifetime. The ambient environment can be air, vacuum, inert gas, filled with desiccants(s), getters, etc. In addition, the packaging can include metallic cages, etc., to inhibit residual/ambient electric fields from distorting the externally generated E-field for enhancing the performance of the functional semiconductor element(s).

Enhanced Carrier Mobility

As mentioned above, one advantage of immersing one or more functional semiconductor elements in a static E-field in a manner disclosed herein is to enhance carrier mobility within the semiconductor material of the functional element(s) to enhance the performance of the functional element(s). While such enhancement can be beneficial across all phases and types of semiconductors, this can be especially useful in the context of the polycrystalline and amorphous phases and organic semiconductors, which exhibit much promise for the future of flexible and conformal devices.

As an example, amorphous Si:H has no long-range order, unlike crystalline Si. It does, however, have some short-range order, which makes it somewhat similar to crystalline Si. Crystalline Si and amorphous Si:H have band gaps (of 1.1 eV and ~1.7 eV, respectively) and the main chemical bond in both materials is the silicon-silicon bond. Their similarities end there, however. Due to its amorphous nature, carriers travel slowly in amorphous Si:H, due to excessive trapping in localized states and scattering due to the lack of a periodic lattice. Amorphous Si:H thus has electron mobilities as low as 0.1 $cm^2/Vs$ to 1 $cm^2/Vs$.

Amorphous Si:H has considerable bonding disorder at an atomic level, and since the density of states is mostly determined by local bonding configurations, amorphous Si:H will have a modified density of states. The bonding disorder arises from bent bonds and stretched bonds and leads to a "blurring" of the conduction and valence band edge. This is referred to as the "band tails."

Un-hydrogenated amorphous Si:H also contains a large number of defect states in the mid-gap region due primarily to dangling bonds and impurities in the material. These states are very highly concentrated in un-hydrogenated amorphous Si:H, but in hydrogenated amorphous Si:H the dangling bonds are passivated by hydrogen and the number of these states in the mid gap is greatly reduced. It is also possible to have many dangling silicon bond defects at the interface between the nano- and micro-crystalline silicon material and amorphous material, however most of these dangling bonds can be passivated with hydrogen.

There have been many theories proposed over the years to explain the movement of carriers in amorphous and nano-/micro-crystalline materials. In some cases, it has been suggested that single electrons have ballistic motion inside the grains and tunnel through the interface barriers to form the conduction route, whereas in other cases, transport is fundamentally thought to be limited by defects within the crystallites, trapping in the disordered amorphous Si:H region is not the mechanism that was limits transport. This lack of knowledge about the transport and conduction mechanism in these material phases has been one of the biggest challenges. Regardless of the theories on carrier movement, carrier drift mobility goes up drastically under the influence of high E-fields. These E-fields can be provided by any appropriate ones of the electret-based static-E-field sources described above. As those skilled in the art will understand, the characteristics, for example, magnitude(s), directionality(ies), location(s), etc., of the static E-field from such sources can be tailored to the particular application at issue.

It has been demonstrated in experiments performed by the present inventor that high E-fields enhance performance of organic-semiconductor-based devices. As with non-monocrystalline inorganic semiconductors, a number of theories of charge transport and conduction mechanisms have been expressed. For example, a post at http://blog.disorderedmafter.eu/2008/06/05/picture-story-how-do-organic-solar-cells-function/describes a current understanding of how organic solar cells function. That post describes the functioning as a five-step process.

In the first step, light absorption by a bulk heterojunction organic semiconductor is absorbed in the donor material, such as a conjugated polymer. This creates exciton, i.e., strongly bound electron-hole pairs, on the polymer chain. In the second step, the electrically neutral excitons move by diffusion to acceptor sites, such as acceptor sites on fullerene molecules. The diffusion lengths are short and on the order of only a few nanometers. These short lengths favor bulk heterojunction material over the bilayer configuration typically seen in inorganic-semiconductor-based solar cells. In the third step, excitons dissociate when the energy gain is larger than the exciton binding energy. An electron transfer takes place such that the exciton dissociates into an electron on the acceptor, while the hole remains on the donor. This electron-hole pair is still Coulomb bound and is called a "geminate pair" or "polaron pair." In the fourth step, the polaron pairs dissociate into free electron-hole pairs. This occurs in the presence of an E-field that traditionally occurs via a built-in voltage and an applied voltage provided by an external circuit. In the prior art, this fourth step has been viewed as a major loss mechanism of organic solar cells. In the fifth step, the electron and holes created in the fourth step move by a hopping transport process that is driven by the E-field, and it is this action that produces the photocurrent. Thus, even though the mechanisms of photocurrent production in organic-semiconductor-based solar cells may be different from the mechanisms of photocurrent production in inorganic-semiconductor-based solar cells, the performance of organic-semiconductor-based devices is nonetheless enhanced by immersion in static E-fields.

As mentioned above, diffusion lengths of excitons have typically been observed to be relatively small, generally on the order of 20 nanometers or less. However, as reported in a recent article on the photonics.com website titled "Red Crystals May Boost Plastic Solar Cells" and dated Oct. 15, 2010 www.photonics.com/Article.aspx?AID=446626), researchers at Rutgers University have observed exciton diffusion lengths on the order of about 2 microns to 8 microns in a very pure crystal of rubrene. One of the researchers, Dr. Vitaly Podzorov, noted that "Once the exciton diffusion distance becomes comparable to the light absorption length, you can collect most of the sunlight for energy conversion." This and follow-on advances in organic semiconductors have the potential for making the future of organic-semiconductor-based solar cells (and other devices) very bright. Even with the increases in efficiency that new organic semiconducting materials will bring, there will likely be a synergy between those new materials and the static E-field immersion techniques disclosed herein. It is also noted that the increase in exciton diffusion lengths noted above has made the researchers fundamentally question the current understanding of organic solar cells and how they operate.

Depletion Region Modulation

Figure 7:
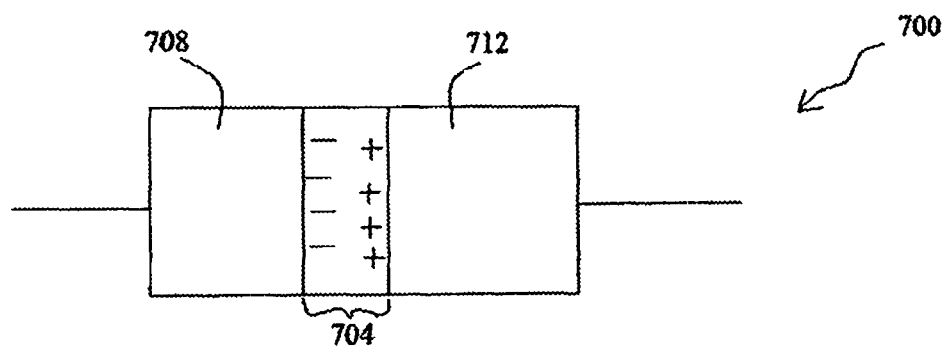
FIG. 7 is a schematic diagram of a p-n junction device, illustrating the depletion region of such a device.

FIG. 7 shows a p-n junction device 700 to illustrate the depletion region 704 that forms across the junction (not shown) between a p-type semiconductor material 708 and an n-type semiconductor material 712. Along this junction, electrons from n-type material 712 "diffuse" into the holes residing in p-type material 708. When diffusion is complete, as shown in FIG. 7 depletion region 704 takes the form of alternating positive and negative rows of charges. On the p-side of depletion region 704 are holes that have been filled with diffusing electrons from the n-side. The p-side of depletion region 704 is left with a slight negative charge, while the n-side of the region becomes slightly positive, since the loosely bound electrons have dropped into holes on the p-side. An electric field is produced in depletion region 704, which creates a force in the direction of n-type material 712 on any electrons that pass nearby, while simultaneously pushing holes towards p-type material 708. This field acts as a barrier to electrons moving from n-type material 712 to p-type material 708 until a "threshold" voltage is reached, at which point electrons are free to flow through device 700.

In equilibrium, there will be no net motion of charges within the p-n junction. However, if a valence electron is knocked free of a semiconductor atom, for example by an incoming photon in the context of a solar cell, then due to the electric field produced in the depletion zone, any free electrons produced will tend towards n-type material 712, while any holes produced will tend towards p-type material 708.

Each photon with enough energy will normally free exactly one electron, and result in a free hole as well. If this happens close enough to the electric field, or if the free electron and free hole happen to wander into its range of influence, the field will send the electron to the n-side and the hole to the p-side. This causes further disruption of electrical neutrality, and if an external current path is provided, electrons will flow through the path to their original side (i.e., the p-side) to unite with holes that the electric field sent there, doing work along the way. The electron flow provides the electrical current, and the solar cell's electric field causes a voltage. With both current and voltage, power, which is the product of the two, is produced.

For an ideal solar cell, for longer wavelengths the width of depletion region 704 must be as wide as possible in order to obtain high photocurrent. This is due to the fact that typically absorption co-efficient of semiconductor materials is lower at higher wavelengths when compared to lower wavelengths. A wider depletion region can be achieved by reducing the dopant concentration. However, lower doping reduces the open circuit voltage, Voc, of the solar cell. At lower wavelengths, the absorption co-efficient tends to be high, and, therefore, depletion region 704 must be made as small as possible so that the photons will be absorbed near the p-n junction. However, a smaller depletion region will increase unwanted surface recombination thus the series resistance will increase; consequently the solar cell's efficiency is reduced. This means the solar cell efficiency is limited by the device and design parameters.

Figure 8:
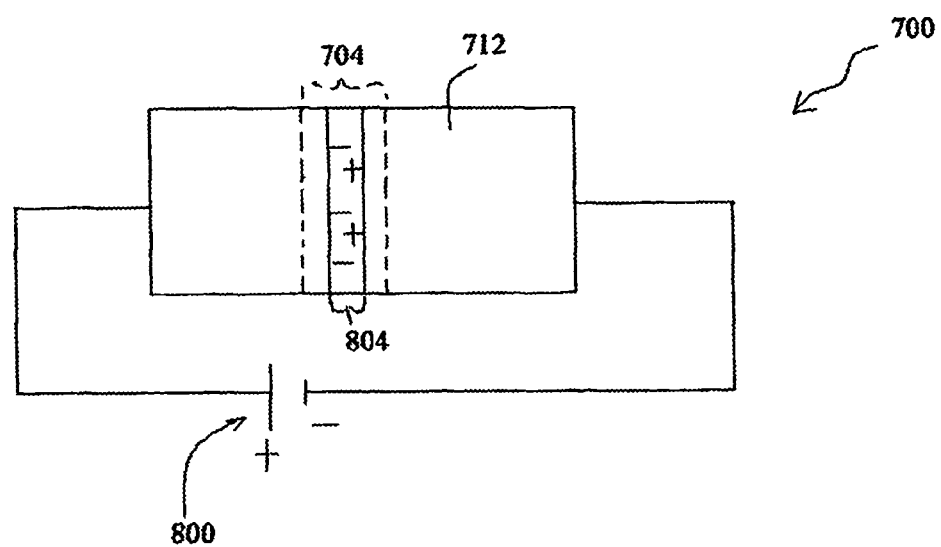
FIG. 8 is a schematic diagram of the p-n junction device of FIG. 7 connected to a battery so as to be forward biased.
Figure 9:
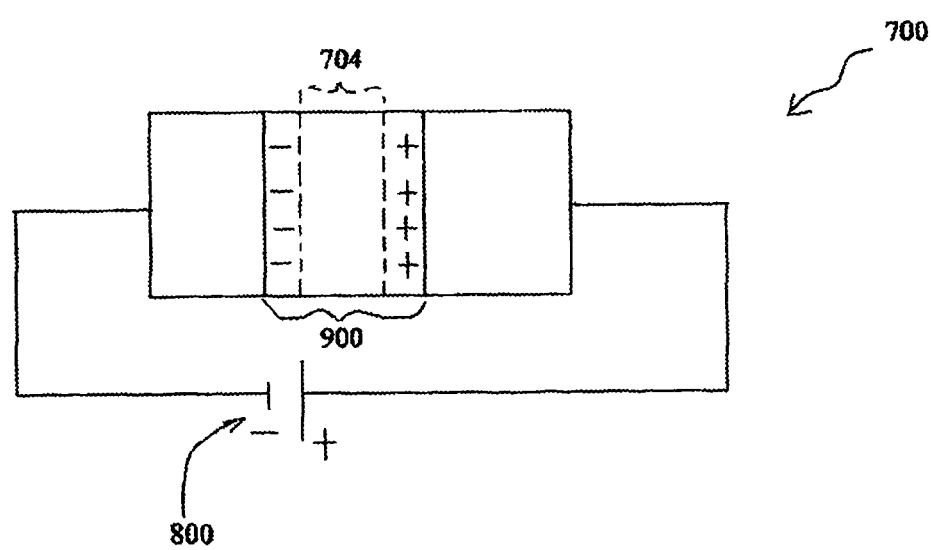
FIG. 9 is a schematic diagram of the p-n junction device of FIG. 7 connected to a battery so as to be reversed biased.

When p-n junction device 700 is operated as a diode and connected to a voltage source 800 as shown in FIG. 8, the diode is in a forward-bias mode. A negative charge from voltage source 800 to n-type material 712 forces the loosely-held electrons in the n-type material to move towards depletion region 704, while the positive terminal of the battery pushes holes into the depletion region to be filled with the incoming electrons. The result is that the voltage barrier in depletion region 704 shrinks. In other words, depletion layer 704 shrinks, as indicated by narrowed depletion region 804 of FIG. 8. This narrowing can be seen by comparing the widths of depletion region 804 of FIG. 8 to depletion region 704 of FIG. 7. As illustrated in FIG. 9, when p-n junction device 700 is connected to voltage source 800 so as to be under a reverse bias, the exact opposite effect takes place. That is, a widened depletion region 900 is formed. This widening can be seen by comparing depletion region 900 of FIG. 9 with depletion region 704 of FIG. 7.

The present inventor has found that depletion region narrowing and widening similar to the narrowing and widening resulting from forward and reverse biasing a p-n junction device can be achieved by subjecting depletion-region containing p-n junction devices to static E-fields having the appropriate directionality. These static E-fields can be provided by any suitable one of the electret-based E-field sources described above. As those skilled in the art will understand, the characteristics, for example, magnitude(s), directionality(ies), location(s), etc., of the static E-field from such sources can be tailored to particular applications so as to provide the desired narrowing/widening of the depletion regions at issue.

EXAMPLES

Following are a few select examples of semiconductor-based devices that include electret-based E-field sources for "immersing" the one or more functional semiconductor elements of those devices in a static E-field so as to enhance the functioning of such element(s). These examples should in no way be taken as limiting, but rather illustrative. Those skilled in the art will readily understand how to configure other static-E-field enhanced devices using the teachings of the present disclosure.

Solar Cell Devices

Figure 10:
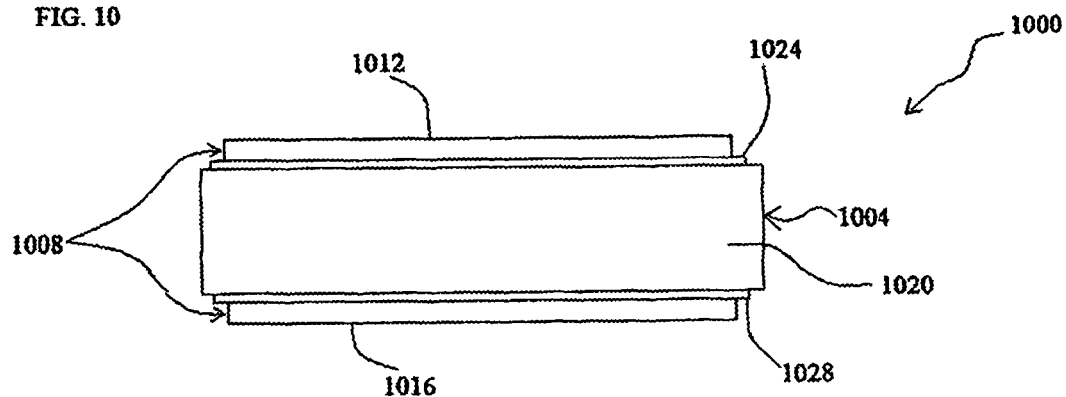
FIG. 10 is a schematic diagram of a solar cell device that includes a static-E-field source to enhance performance of the device.

FIG. 10 illustrates a solar cell device 1000 made in accordance with the present disclosure. Solar cell device 1000 includes a solar cell 1004 and an electret-based E-field source 1008 that sandwiches the solar cell between two plates 1012, 1016 of the E-field source. Solar cell 1004 can, for example, have a construction the same as or similar to the construction of virtually any solar cell based on organic and/or inorganic semiconductors. The semiconductor material of such a solar cell can have any morphology, such as amorphous, nano-crystalline, micro-crystalline, polycrystalline, etc. Critical challenges for such cells include low photo-generated carrier mobility due to lack of long-range order, potential barriers at grain boundaries, etc.

Specific examples of inorganic solar cells that can benefit from the static E-field immersion techniques of the present disclosure include polycrystalline silicon solar cells, amorphous Si:H thin film p-n and p-i-n solar cells, nano-crystalline or micro-crystalline silicon solar cells, cadmium-telluride solar cells, copper indium gallium di-selenide and copper indium selenide solar cells, heterojunction with thin intrinsic layer silicon solar cells, spheral silicon solar cells, plasmonics-enhanced solar cells, and nanostructure/nanotextured solar cells, multi junction solar cells, III-V solar cells, intermediate band solar cells and other quantum confined solar cells, single- and multi junction solar cells on uni-axial and bi-axial textured substrates, among others.

Specific examples of organic solar cells that can benefit from the static E-field immersion techniques of the present disclosure include organic polymer solar cells, dye-sensitized solar cells, dye-sensitized nanocrystalline solar cells, nano-structured/nanotextured solar cells; nanocrystalline polymer solar cells, hybrid organic semiconductor solar cells, hybrid nanorod polymer solar cells, and plasmonics-enhanced solar cells, among others.

Regardless of whether solar cell 1004 is inorganic or organic semiconductor based, its performance can be enhanced by static E-field immersion in a manner that increases carrier mobility. In addition, if solar cell 1004 is inorganic semiconductor based, static E-field immersion can increase the width of the depletion region that straddles the p-n junction (not shown) of the cell. Such E-field immersion can also act to reduce potential grain boundaries.

In this example, solar cell 1004 includes a semiconductor region 1020 having front and back ohmic contacts 1024, 1028 located on opposing sides of the semiconductor region. Contacts 1024, 1028 can be continuous/unpatterned or, as described in more detail below, can be patterned with fingers (e.g., like a comb structure). It will be understood that there can be additional localized E-fields and electrical shields created by the positioning and shaping of the contacts. In some cases, this might require a reversal in the polarities of the electret(s). For nanostructure/nanotextured solar cells, the geometrical shape/surface of the nanostructure/nanotexture can lead to significant local E-field enhancement that can further assist in modulating the width of the depletion region(s) within the p-n junction regions of those types of solar cells. Immersion of solar cell 1004 in a static E-field using electret-based E-field source 1008 in accordance with the present disclosure can also be used to increase the mobility of the photo-generated carriers by decreasing the time these carriers take in reaching front and back contact 1024, 1028, thereby enhancing the performance of the solar cell. It is known that the recombination losses due to photo-generated carriers not reaching contacts 1024, 1028 gives rise to significant losses in a solar cell.

Figure 11:
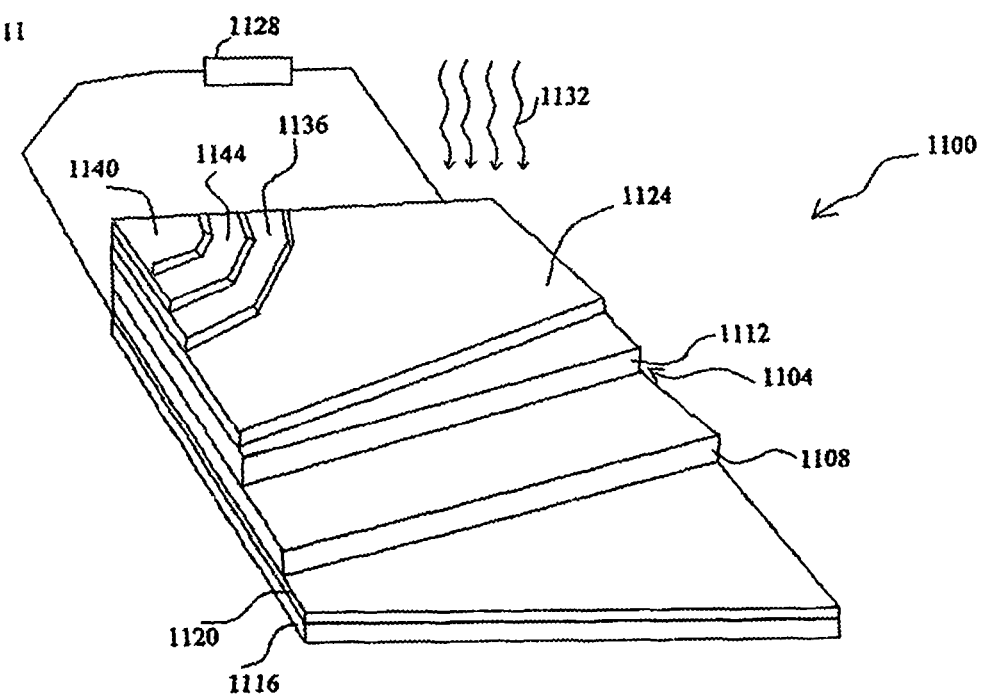
FIG. 11 is a perspective partial cutaway view of a solar cell that can be used in the solar cell device of FIG. 10.

FIG. 11 illustrates an exemplary solar cell 1100 that can be adapted for use in solar cell 1004 of solar cell device 1000 of FIG. 10. In FIG. 11, solar cell 1100 includes a p-n junction region 1104 formed by a p-type semiconductor 1108 and an n-type semiconductor 1112, which, in this example, are formed over a substrate 1116. A pair of ohmic contacts 1120, 1124 are located on opposing sides of p-n junction region 1104. Contacts 1120, 1124 are connected to circuitry 1128 that draws power from solar cell 1100 when photons 1132 of sunlight impinge upon p-n junction region 1104. This particular solar cell 1100 includes an anti-reflective coating 1136 and a cover glass 1140 that is secured to the anti-reflective coating by a transparent adhesive 1144.

The process of fabricating solar cell 1100 includes conditioning a suitable substrate for further processing, depositing/forming contact 1120, depositing/forming p-type semiconductor 1108, depositing/forming n-type semiconductor 1112, depositing/forming contact 1124, depositing/forming anti-reflective coating 1136, applying transparent adhesive 1144, and engaging cover glass 1140 with the adhesive. Procedures for performing each of these steps are well known in the art.

Skilled artisans will readily appreciate that solar cell 1100 can be incorporated/adapted into solar cell device 1000 of FIG. 10 by adding an electret-based E-field source 1008 in any of the manners described above. As an example, finished solar cell 1100 (FIG. 11) could be sandwiched between two sheets, one or both of which can be an electret sheet. Again, if only one electret sheet is used, the other sheet could be a grounded sheet. Each of such sheets forming E-field source 1008 (FIG. 10) could be added directly adjacent to cover glass 1140 (FIG. 11) and to substrate 1116, respectively, or could be spaced from the cover glass and substrate by one or more intervening layers.

As an alternative, the components of E-field source 1008 (FIG. 10) can be incorporated into solar cell 1100 (FIG. 11) at various stages during fabrication. For example, instead of forming contact 1120 directly on substrate 1116, a first layer of E-field source 1008 (FIG. 10), either an electret layer or a grounded layer, could be formed on the substrate before the formation of contact 1120. After forming the first E-field source layer, an insulating layer could then be formed prior to forming contact 1120 and other components of solar cell 1100. On the opposite side of solar cell 1100, after contact 1124 is formed, an electrically insulating layer can be formed on contact 1124, then a second layer of E-field source 1008 (FIG. 10) formed on the insulating layer. Similarly, the second layer can be either an electret layer or a grounded layer, as appropriate. After forming the second E-field source layer, anti-reflective coating 1136 (FIG. 11), adhesive 1144, and cover glass 1140 could be added to complete solar cell device 1000 (FIG. 10). Of course, those skilled in the art will recognize other configurations/layering of the layers of each of solar cell 1100 (FIG. 11) and components of E-field source 1008 are possible.

While solar cell 1100 shown is depicted as an inorganic-semiconductor-based device, those skilled in the art will readily appreciate that this solar cell can be readily adapted to organic semiconducting materials. For example, inorganic p-type and n-type semiconductors 1108, 1112 can be changed to organic acceptor and donor materials, respectively. Alternatively, inorganic p-type and n-type semiconductors 1108, 1112 can both be replaced by organic semiconductors, including a bulk heterojunction mixture.

The field of organic solar cells is relatively new. Typical organic solar cells herein include "traditional" heterojunction cells, metal-organic composite (i.e. plasmonics enhanced) organic cells, and any cells based on a variety of nano-transformational techniques and nano-particle (quantum dot)/crystal augmentation. Important limiting factors of organic cell efficiency are exciton diffusion, charge transport, charge injection barriers, and work function mismatch between interfaces, which depend on charge carrier mobility in the E-fields created internally by the device materials and structure. An externally generated static E-field from the addition of an electret-based E-field source, as revealed in this disclosure can dramatically aid in transporting charge carriers (and reducing the charge potential barriers) to contacts, minimizing recombination and trapping, and forming space charges that will otherwise oppose drift of carriers of the same charge.

As described above, organic solar cells typically rely on photon absorption in a donor material (e.g., a conjugated polymer with delocalized π-orbital electrons), which is excited from its highest occupied molecular orbitals (HOMO) to its lowest unoccupied molecular orbitals (LUMO), in a π-π* transition. Photons so absorbed (λ is determined by the energy bandgap between these orbitals) generate excitons (bound electron-hole pairs), which diffuse to an interface with an acceptor material (e.g., fullerenes) where a charge transfer can occur. The carriers are separated, electrons move to an "anode" contact and the holes to a "cathode," per the intrinsic E-field created in the device.

However, excitons in an organic photovoltaic cell are strongly bound with 0.1 eV to 1.4 eV energy; the electron-hole pair dissociate by an interface across which the potential of the electrons decreases, although they may still be joined as a geminate pair, and separated by the internal E-field (voltage) created by the cell itself. Diffusion paths are extremely short (3 nm to 10 nm) before recombinations occur, and the useful region at the acceptor boundary are extremely narrow (10 nm). Since charge mobility in organic materials is also extremely low ($<<1$ $cm^2/Vs$), realizable current is correspondingly low. Moreover, prevalent organic materials in use favor holes, and electron/hole mobilities are highly imbalanced, leading to trapped space charge buildup, thereby further retarding current. An externally generated E-field provided by an electret-based E-field source, as revealed in this work, would significantly affect this fundamental device physics.

Very thin solar cells minimize diffusion lengths, for example, but also photon absorption. Bulk heterojunction materials are typically therefore used, which mix advanced new polymer "inks" with fullerenes, separated only by nanometers in a phase separated blend. "Islands" of material can form without conductive paths to an electrode, however, and form barriers. Changing the electrode surfaces can repulse fullerenes, minimizing such effects.

Ordered heterojunctions are yet another hybrid approach, mixing polymer donor materials into a structured inorganic ceramic acceptor such as $TiO_2$. But holes must still diffuse along a path in the polymer to a contact, so there are limits to the realizable thickness of the photon absorption (donor) layer.

Variations to this approach include using acceptor nanoparticles or nanorods embedded in a donor polymer matrix, providing a very large effective area for the interface while forming conductive percolation networks for electrons to reach the electrode. Carbon nanotubes (CNTs), for example, have been incorporated into polymers to aid exciton dissociation and provide percolation pathways for higher mobility and charge transfer. Metal nanoparticles can be applied to the CNT exteriors to increase the exciton separation efficiency and transport, in the presence of E-fields.

Other approaches include dye-sensitized or Grätzel cells, classically based on a photosensitive dye beneath a clear (typically, ITO:F) anode, but atop a thin, highly porous $TiO_2$ layer for a very large effective surface area, all atop an electrolyte. Photons absorbed by the dye excite electrons that enter into the conduction band of the $TiO_2$, then diffuse due to the internal E-field caused by electron concentration to the clear top anode. The missing electrons are replenished by a fast reaction in the electrolyte where iodide oxidizes to tri-iodide, in turn diffusing to the bottom electrode to collect electrons from the external circuit. Grätzel cells offer various advantages and disadvantages, but only electrons are involved so that there are few or no recombination losses—they offer the higher theoretical efficiency than traditional organic cells.

Still another leading approach involves nanocrystals, or quantum dots (QDs), which can now be cost-effectively spin-coated over a flat substrate; for example, QDs of PbSe, CdTe or other combinations can be embedded in a polymer composite. Multiple exciton generation (MEG) can occur under the right conditions, theoretically enabling efficiencies to 65%. One such condition is an E-Field of sufficient strength, one that can be considerably enhanced by the proposed methodology disclosed herein.

Furthermore, nanostructured metal-organic composite solar cells can leverage the emerging field of "plasmonics," or surface plasmons (polaritons) excited by nano-antennas created by structuring the surfaces of metals. $Ag/SiO_2$ nanoclusters, for example, have been shown to enhance photon absorption in organic thin films. Silver particles can concentrate the E-fields and store energy, preferentially creating excitons closer to the acceptor interface, which aids disassociation and charge transfer, effects which can be enhanced by superimposing an external E-field from electret-based E-field sources disclosed herein.

In all these examples of leading research, charge transport and charge potential barriers are recurring bottlenecks that are functions of internal charge concentration gradients, space charge buildup, trapped charge effects, etc. As revealed in this disclosure, the increased charge mobility and reduction in charge potential barriers of the photo-generated carriers can serve to increase efficiency of such organic solar cell devices. That is, one can take a generic organic solar cell and implement an electrets-based static-E-field source of the present disclosure. The externally generated external E-field using such a static E-field source will increase the mobility of the light generated photo carriers and also reduce the charge-potential barriers and thereby enhance the solar cell's performance.

In other embodiments, enhancing inorganic and organic solar cells with electret-based E-field sources can be used to decrease the width of the depletion region at the p-n junctions within such solar cells. At lower wavelengths, absorption coefficients tend to be high, and, therefore, the depletion region must be made as small as possible so that the photons will be absorbed near the p-n junction. However, a smaller depletion region will increase unwanted surface recombination, and, thus, the series resistance will increase. Consequently, the solar cell's efficiency is reduced.

As discussed above in connection with FIGS. 7 and 8, when a p-n junction is operated in a "forward-bias" mode, negative charge from a voltage source 800 provided to the n-type material 712 forces the loosely-held electrons in the n-type material to move towards depletion region 704, while the positive side of the voltage source pushes holes into the depletion region to be filled with the incoming electrons. This results in the voltage barrier located at depletion region 704 to shrink. In other words, the width of depletion layer 704 shrinks. An electret-based E-field source of the present disclosure can be engaged with a generic solar cell in a manner that the externally generated E-field from the source decreases the width of the depletion layer and thereby enhances the solar cell's performance.

Figure 12:
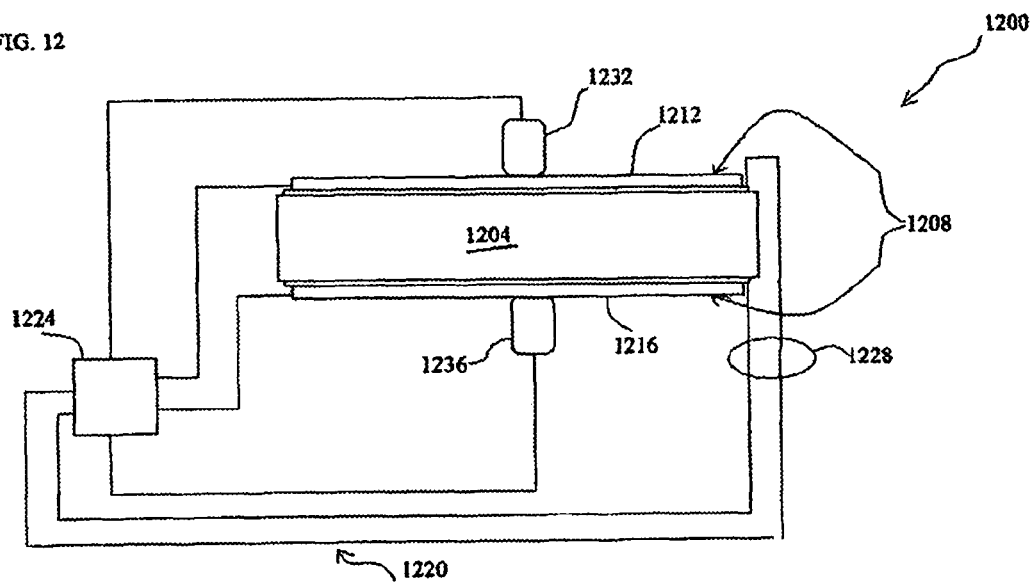
FIG. 12 is a schematic diagram of a solar cell system having recharging circuitry for recharging the E-field source.

FIG. 12 illustrates an exemplary solar cell system 1200 that includes a solar cell 1204 enhanced with an electret-based static-E-field source 1208. Solar cell 1204 can be, for example, any one of the organic or inorganic semiconductor-based solar cells described or mentioned above. Similarly, static-E-field source 1208 can be, for example, any of the embodiments of such E-field source described or mentioned above that includes one or more electrets. In the example shown, solar cell system 1200 includes two oppositely charged electrets 1212, 1216.

Some electrets used in static-E-field source 1208 may experience charge depletion over time. To account for this, solar cell system 1200 also includes recharging circuitry 1220 for recharging the electret(s) of the static-E-field source, in this example electrets 1212, 1216 of static-E-field source 1208. In the embodiment shown, recharging circuitry 1220 includes a controller 1224, a voltage source 1228, and a pair of charge sensors 1232, 1236. Here, voltage source 1228 is solar cell 1204 itself, but in other embodiments the voltage source may be a source other than a solar cell, such as one or more batteries or a power network. Sensors 1232, 1236 sense the level of charge on/in corresponding respective ones of electrets 1212, 1216 and output voltage level signals (not shown) to controller 1224. In this example, controller 1224 is configured to respond to these voltage level signals so as to cause charging circuitry 1220 to charge each of electrets 1212, 1216 when the corresponding voltage level signal indicates that the charge level on that electret has dropped below a preset minimum voltage and while the corresponding voltage level signal indicates that the charge level on that electret has not yet reached a preset charge level. Those skilled in the art will readily understand how to implement charging circuitry 1220 and each of its components using only knowledge commonly known to those of ordinary skill in the art without undue experimentation regardless of the techniques utilized, whether they are analog techniques, digital techniques, or a combination of both.

Figure 13:
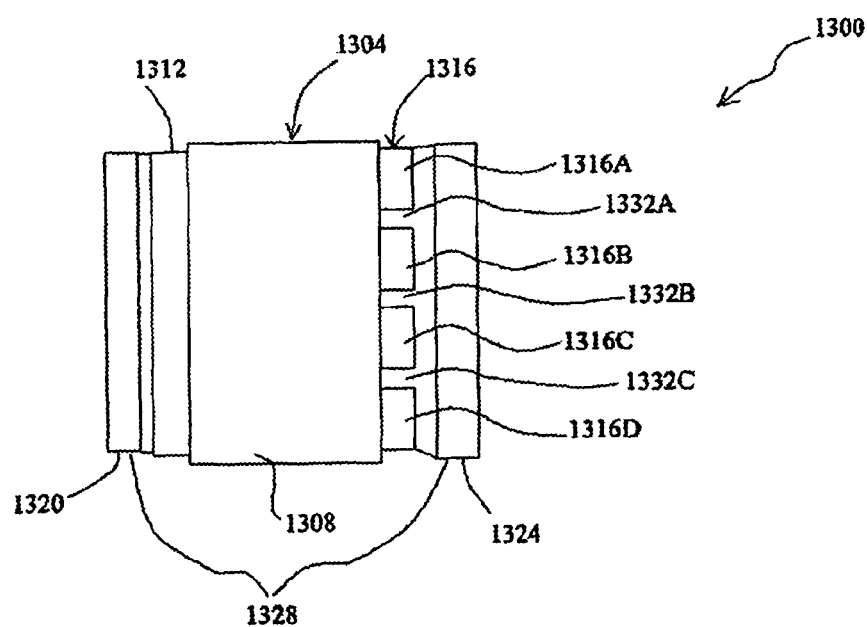
FIG. 13 is a schematic diagram of a solar cell enhanced with a static-E-field source, wherein the front electrical contact is segmented.

FIG. 13 illustrates a variation on solar cell 1100 described above relative to FIG. 11. FIG. 13 shows an electret-enhanced solar cell device 1300 that includes a solar cell 1304 having a semiconductor body 1308 sandwiched between a pair of ohmic contacts 1312, 1316. The entire assembly of semiconductor body 1308 and contacts 1312, 1316 is located between components 1320, 1324 of an electret-based static-E-field source 1328. A primary difference between solar cell 1100 of FIG. 11 and solar cell 1304 is that contact 1316 has fingers 1316A-D, is segmented, or is otherwise provided with one or more E-field windows, here open regions 1332A-C having no contact material. In some embodiments, continuous contacts can cause the magnitude of the E-field across semiconductor body 1308 to be reduced to less than optimal levels, and the presence of open regions 1332A-C has been found to help minimize the drop in the E-field magnitude. While only contact 1316 is shown as having open regions 1332A-C, those skilled in the art will readily appreciate that contact 1312 can be provided with open regions as well. Those skilled in the art will also understand that semiconductor body 1308 can include, for example, any of the semiconductor compositions described or mentioned above, regardless of whether they are organically or inorganically based. Similarly, static-E-field source 1328 can be, for example, any of the embodiments of such E-field source described or mentioned above that includes one or more electrets.

Light Emitting Diode Devices

Figure 14:
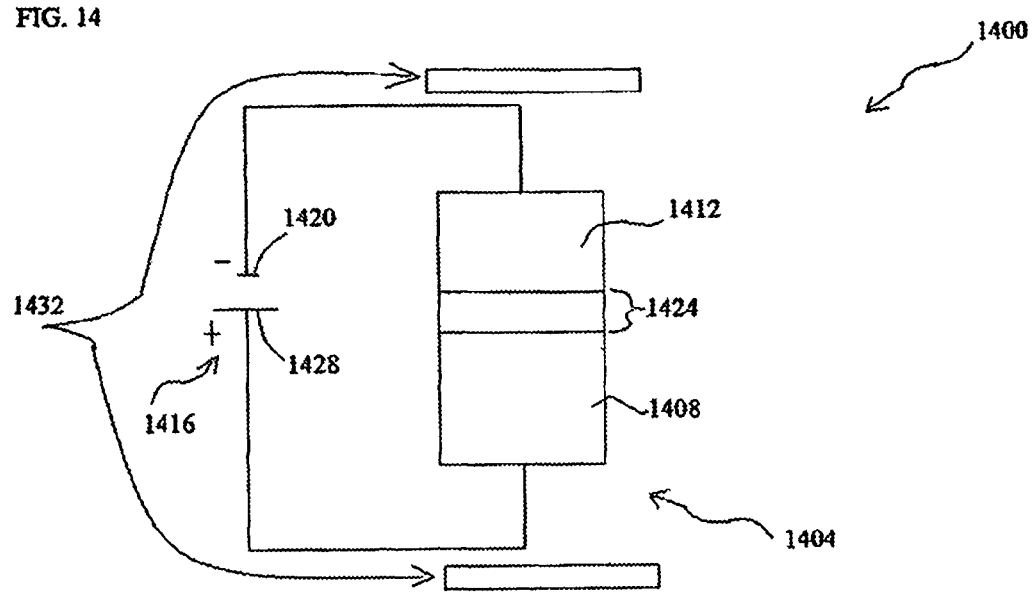
FIG. 14 is a schematic diagram of a semiconductor-based device containing a light-emitting diode enhanced with an electret-based E-field source.

Light emitting diodes (LEDs) are very similar to solar cells, albeit they operate in reverse. Light is generated when power is applied to a semiconductor junction between donor and acceptor materials. FIG. 14 illustrates a semiconductor device 1400 that includes a generic forward-biased inorganic-semiconductor-based p-n junction LED 1404 that includes a p-type material 1408 and an n-type material 1412. LED 1404 is powered by a battery 1416. In operation, a negative charge from the negative terminal 1420 of battery 1416 connected to n-type material 1412 forces the loosely-held electrons in the n-type material to move towards the depletion region 1424, while the positive battery terminal 1428 pushes holes into the depletion region to be filled with the incoming electrons. These injected electrons/holes can radiatively recombine in depletion region 1424, thereby producing light (or more correctly, radiation, such as UV, VIS, IR, FIR, etc.

In general for inorganic LEDs, the starting (base) semiconductor materials used in making the LEDs are either high quality crystalline bulk wafers or highly crystalline thick/thin films that are low in defect density. GaN and its family of alloys, such as AlGaInN, are central to current solid-state lighting technology and are among the most polar of the III-V semiconductors; however others include AlN, InN, ZnO, etc.

Manufacturing bulk native GaN wafers or even high quality thin films on non-native substrate has been a challenge. Poly-crystalline GaN and amorphous GaN can be grown on a wide variety of non-native substrates. However, the efficiency of light output from devices created in poly-crystalline and amorphous GaN LEDs is significantly lower than that from low defect density, single crystalline materials (films). This is primarily due to non-radiative recombination at grain boundaries and the high potential barriers between grain boundaries to charge transport. In addition, even in single crystal GaN devices, there is significant loss of efficiency due to non-radiative recombination of injected carriers/charges as the starting GaN material/films suffer from high levels of defect density.

To enhance the performance of LED 1404, for example to mitigate efficiency losses due to deficiencies just noted, LED device 1400 includes an electret-based static-E-field source 1432, which can be the same as or similar to any of the electret-based static-E-field sources described above. The externally generated E-field provided by static-E-field source 1432 can allow one to modulate (increase or decrease) the width of depletion region 1424 (and also the charge injection barriers) of LED 1404 and, thereby, enhance the LED's performance. Such E-field immersion will also increase the drift mobility of the injected carriers (electrons/holes), thereby increasing efficiency.

As those skilled in the art will understand, generic LED 1404 may be organic or inorganic. Inorganic LEDs suitable for use as LED 1404 include, but are not limited to, simple p-n or p-i-n junction LEDs, homo or heterojunction LEDs, resonant cavity LEDs, and interband LEDs. They can also include quantum confined structures, such as quantum wells, quantum wires, quantum dots, strained quantum wells, and superlattice, within them. In addition, they can operate in the UV, Vis, IR and FIR region of the electro-magnetic spectrum. As revealed in this work, the reduction in charge injection barriers of the injected carriers using externally applied E-fields can serve to increase efficiency of such inorganic crystalline, polycrystalline, and amorphous LEDs.

In addition, it is widely known that light emitting diodes can be fabricated out of organic films. Organic light emitting diodes (OLEDs) have been demonstrated in a variety of organic chemistries, such as small molecule fluorescent OLEDs (SMOLED), polymer fluorescent OLEDs (PLED), phosphorescent small molecule OLEDs (PHOLED), conjugated polymers, organic metal complexes, etc. A multitude of architectures such as p-n junction, p-i-n junction, heterojunctions etc., (as outlined for inorganic LEDs above) have been similarly realized in OLEDs.

As detailed extensively above, charge transport and charge injection barriers are a recurring bottleneck in such organic devices. The present inventor contends that the use of the externally generated, quasi-permanent E-fields, as revealed herein, will allow for a reduction in the charge injection barriers of the injected carriers and serve to increase the efficiency of such organic LEDs. Furthermore, as is known in prior art, the wavelength of light emitted by an LED may be shifted by reverse biasing the LED. So, as revealed above, one can vary the depletion layer width, and hence light emission of the LED (either wavelength and/or amplitude) as desired, by an externally generated E-field.

Field-Effect Transistor Devices

Figure 15:
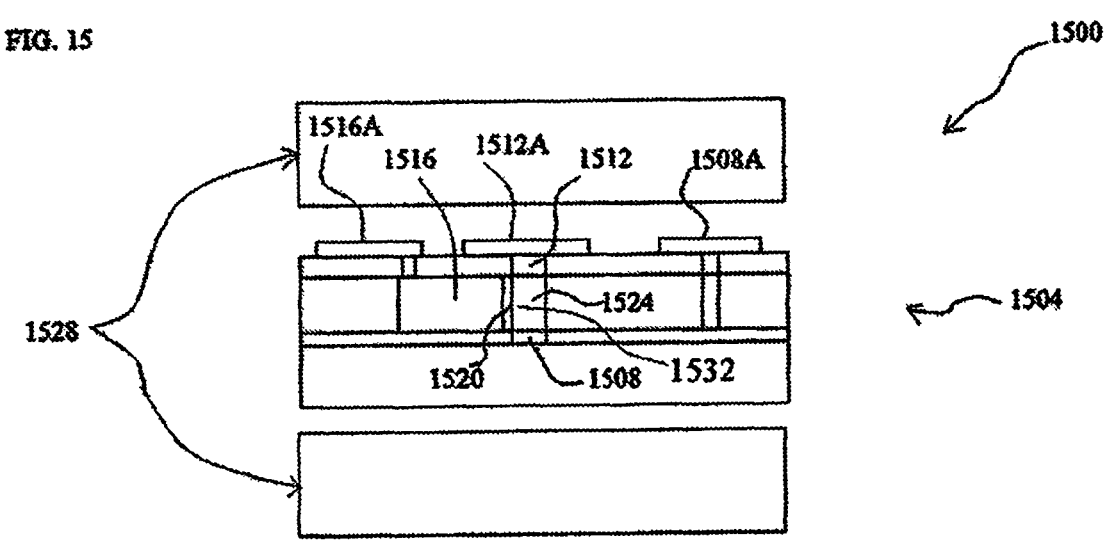
FIG. 15 is a schematic diagram of a semiconductor-based device containing a plurality of vertical field effect transistors enhanced with an electret-based E-field source.

The present inventor submits that immersing semiconductor devices in E-fields as revealed herein is not necessarily limited to solar cells and light emitting devices. On the contrary, these immersion techniques can be used to enhance the performance of other semiconductor devices, such as, for example, field-effect transistors (FETs). For example, FIG. 15 illustrates an FET device 1500 that includes a generic top-gate transistor, or vertical FET (VFET) 1504. As those skilled in the art will readily appreciate, there are a variety of device architectures in current use, each tailored for optimum devices performance. However, they all typically have at the very least a source 1508, a drain 1512, a gate 1516, a gate insulator 1520, and a channel layer 1524 as shown in FIG. 15. Also shown are contacts 1508A, 1512A, 1516A for, respectively, source 1508, drain 1512, and gate 1516.

In accordance with the E-field immersion techniques disclosed above, FET device 1500 also includes an electret-based static-E-field source 1528, which can be, for example, any one of the electret-based static-E-field sources described above. The externally generated E-field from static-E-field source 1528, depending on the directionality of the E-field, increases or decreases the width of the depletion region 1532 surrounding the source/drain regions from channel layer 1524 and modulates the performance of VFET 1504 by decreasing or increasing the length of the channel. VFET 1504 can be of either the PMOS or NMOS variety and can have any suitable structure, such as planar structures, staggered structure, etc. The semiconductor material in channel 1524 can be amorphous, nanocrystalline, microcrystalline, polycrystalline, single crystal in morphology. It can also be organic, inorganic, or hybrid, i.e., include both organic and inorganic materials. The ability to decrease the length of channel 1524 will result in faster circuits and lower power consumption in devices implementing this E-field immersion technology.

Experimental Data

Figure 16:
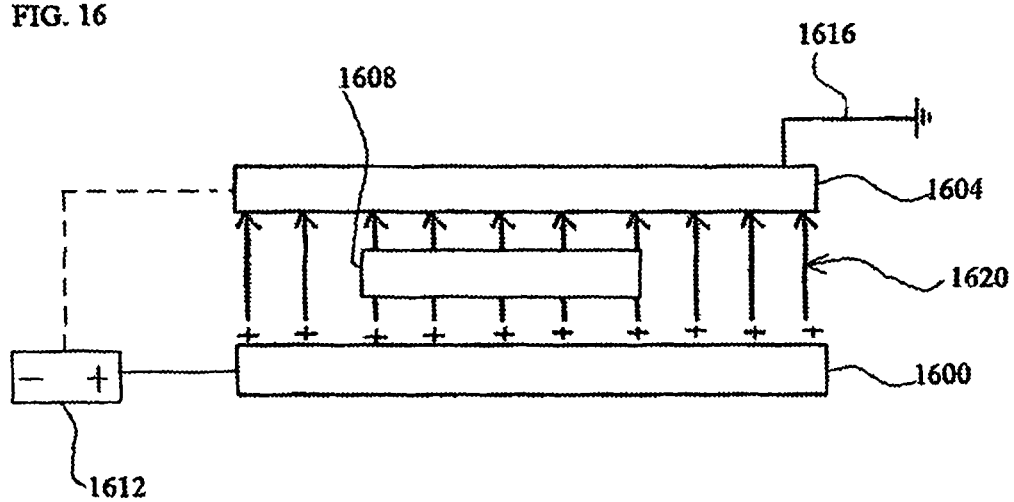
FIG. 16 is a schematic diagram of a test setup for testing the performance of an organic photovoltaic (OPV) cell in static E-fields of various magnitudes.
Figure 17:
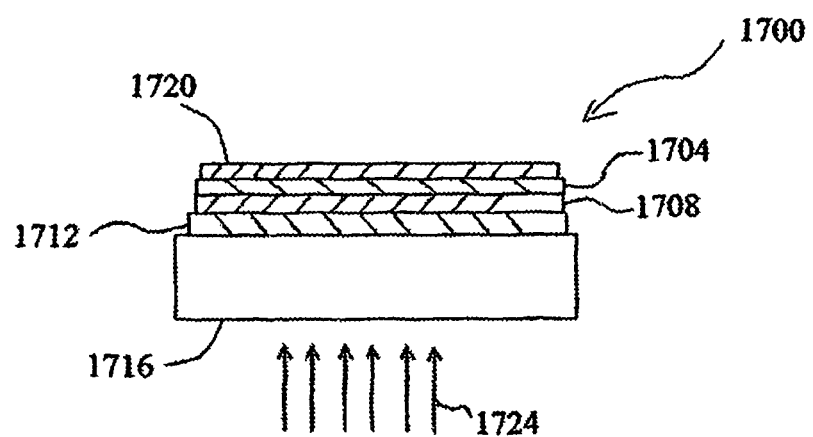
FIG. 17 is a schematic cross-sectional view of a conventional bulk-heterojunction OPV cell made using available chemistry.

To investigate the efficacy of subjecting a functional semiconductor element to a static E-field from an electret-based E-field source, several experiments were conducted. Referring to FIG. 16, these experiments were performed basically using a pair of charged plates 1600, 1604 (to simulate the one or more electrets) and several variants of an organic photovoltaic (OPV) cell 1608, as described below. In one of the experiments, plate 1600 was charged using a high voltage DC power source 1612 and plate 1604 was connected to a ground 1616 so that an E-field 1620 was produced between the plates and across OPV cell 1608. In the other experiments, power source 1612 was connected across plates 1600, 1604 to produce E-field 1620. OPV cell 1608 was a bulk heterojunction OPV cell built using off-the-shelf chemistry available from Plextronics Inc., Pittsburgh, Pa., and that is illustrated in FIG. 17 in its conventional form. Specifically, OPV cell 1608 (FIG. 16) included a PLEXCORE® PV 1000 OPV-based configuration 1700 that comprises a PV 1000 photovoltaic ink layer, or photoactive layer 1704, and a PV 1000 hole transport layer 1708, that is formed on an indium tin oxide (ITO) contact layer 1712, which itself is formed on a glass substrate 1716. In configuration 1700, an aluminum contact layer 1720 is formed on photoactive layer 1704. Photoactivating light 1724 is shone through glass substrate 1716 to cause system to produce electrical power.

Figure 18:
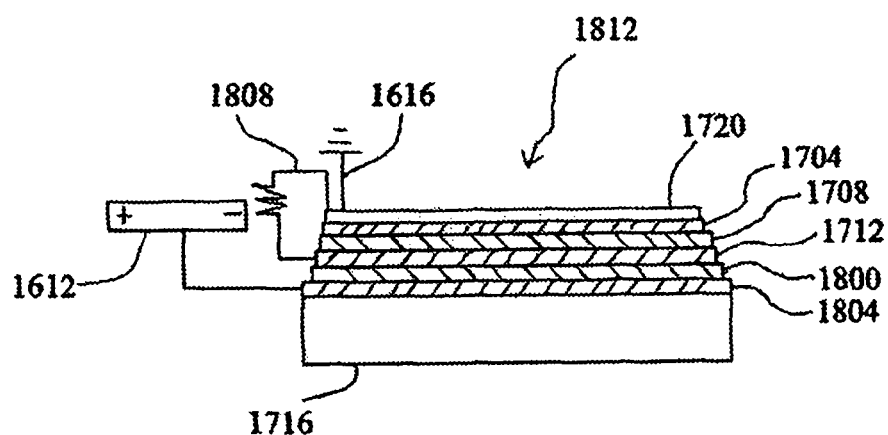
FIG. 18 is a schematic cross-sectional view of a modified version of the OPV cell of FIG. 17 modified to test the performance of the OPV cell in static E-fields of various magnitudes.

For the first experiment, the conventional cell configuration 1700 was modified from the form shown in FIG. 17 to the form shown in FIG. 18 by adding an insulating layer 1800 and a bias ITO layer 1804 to permit electrical biasing, using power supply 1612, to simulate an electret-base E-field source. A load 1808 was placed across contact ITO layer 1712 and aluminum contact layer 1720. Layers 1704, 1708 are the same bulk heterojunction and hole transport layers as before. The modified OPV cell 1812 was then tested. Aluminum contact layer 1720 was connected to ground 1616, and bias ITO layer 1804 was sequentially connected to the positive and then negative terminals of power supply 1612, while modified OPV cell 1812 was exposed to light. The overall intensity measurements were then tabulated and graphed.

Figure 19:
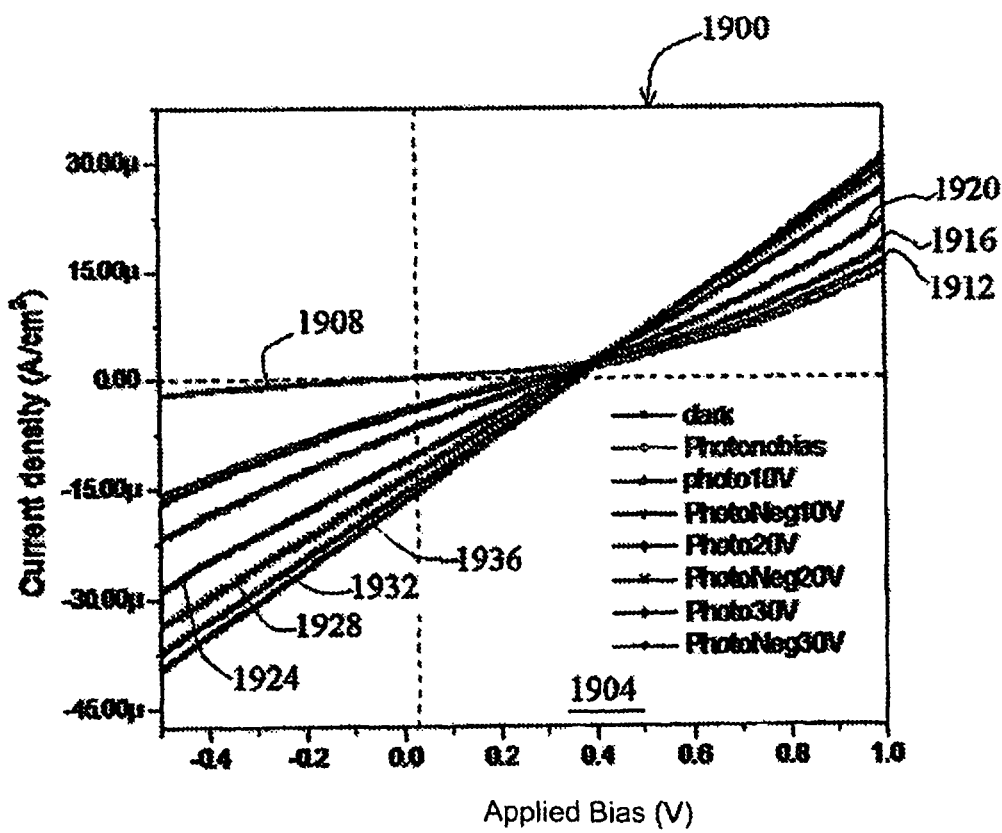
FIG. 19 is a graph of experimental data for current density versus internal applied bias for the modified OPV cell of FIG. 18 under various operating conditions.

Referring now to FIGS. 18 and 19, FIG. 19 is a graph 1900 of data acquired from the first experiment for current density output from modified OPV cell 1812 of FIG. 18 versus internal bias voltage under various conditions of light and E-field-generating voltages applied to bias ITO layer 1804 by power supply 1612. The power generated by OPV cell 1812 is in the fourth quadrant 1904, so that the lower the curve is in the fourth quadrant, the greater the performance of the OPV cell. For clarity: curve 1908 depicts the case in which no light is impinging upon modified OPV cell 1812; curve 1912 depicts the case in which no electrical bias is applied to bias ITO layer 1804 and light is impinging on the OPV cell; curve 1916 depicts the case in which a +10 V bias is applied to the bias ITO layer and light is impinging on the OPV cell; curve 1920 depicts the case in which a −10 V bias is applied to the bias ITO layer and light is impinging on the OPV cell; curve 1924 depicts the case in which a +20 V bias is applied to the bias ITO layer and light is impinging on the OPV cell; curve 1928 depicts the case in which a −20 V bias is applied to the bias ITO layer and light is impinging on the OPV cell; curve 1932 depicts the case in which a +30 V bias is applied to the bias ITO layer and light is impinging on the OPV cell; and curve 1936 depicts the case in which a −30 V bias is applied to the bias ITO layer and light is impinging on the OPV cell.

Figure 20:
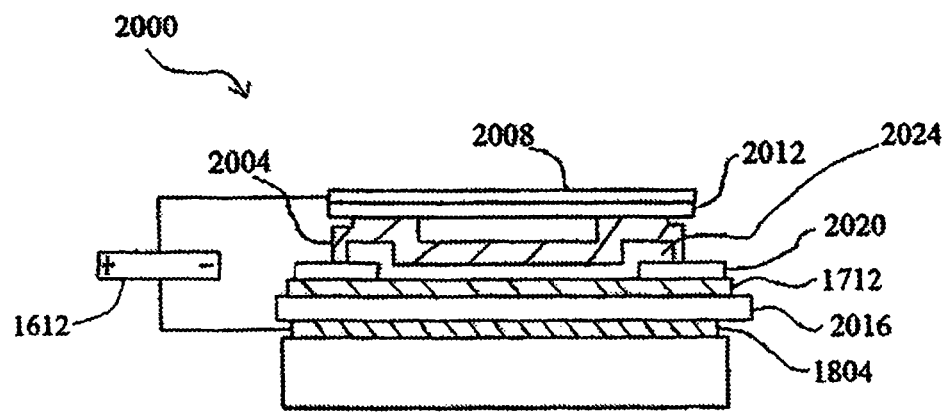
FIG. 20 is a schematic cross-sectional view of a further modified OPV cell in which the aluminum electrode layer has openings that provide E-field windows.
Figure 21:
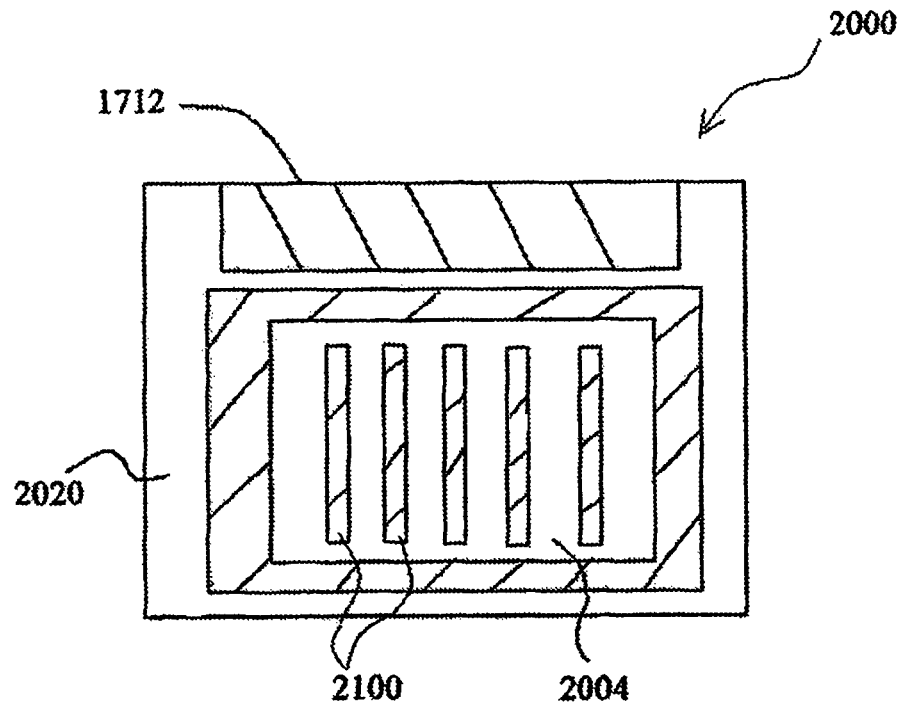
FIG. 21 is a schematic diagram illustrating the configuration of the openings in the aluminum electrode layer of the further modified OPV cell of FIG. 20.

After testing modified OPV cell 1812, the further modified OPV cell 2000 of FIGS. 20 and 21 was constructed. One primary difference in OPV cell 2000 relative to OPV cell 1812 in FIG. 18 is that aluminum contact layer 2004 was provided with openings 2100 (FIG. 21), or E-field windows that were suspected to counteract any E-field shielding effect that a continuous layer may produce. Another primary difference is the addition of a second aluminum layer 2008 spaced from aluminum contact layer 2004 by a polymer tape insulating layer 2012. The second aluminum layer 2008 was used in providing the static E-field by connecting it and bias ITO layer 1804 to opposite terminals of DC voltage source 1612. Yet another difference was the use of an ultra thin glass sheet 2016 (about 100 microns thick) between bias ITO layer 1804 and contact ITO layer 1712. Also included in OPV cell 2000 was a photoresist layer 2020 that prevented underlying contact ITO layer 1712 from shorting out with the overlying aluminum contact layer 2004. Body 2024 contained the bulk heterojunction and hole transport materials corresponding, respectively, to layers 1704, 1708 of OPV configuration 1700 of FIG. 17.

Figure 22:
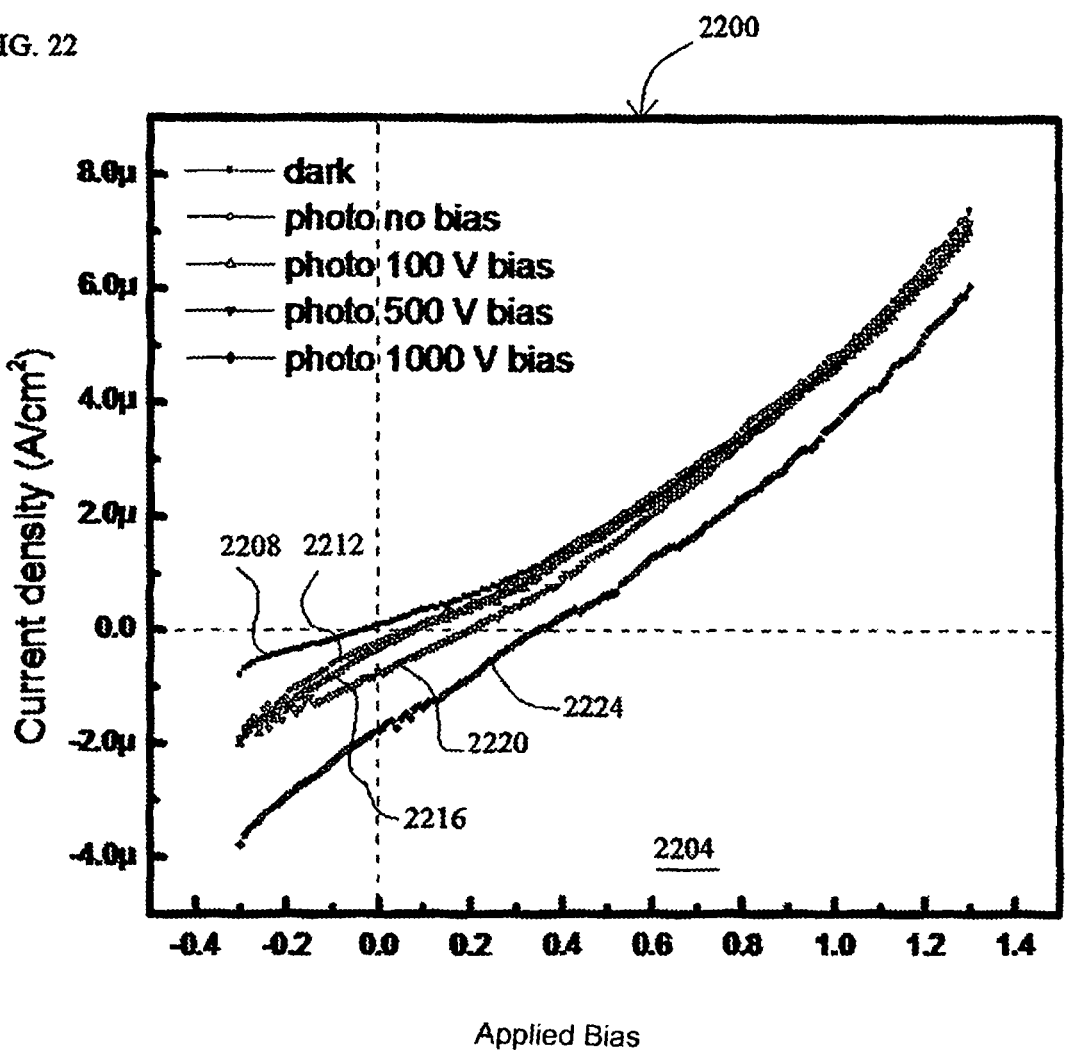
FIG. 22 is a graph of experimental data for current density versus internal applied bias for the further modified OPV cell of FIGS. 20 and 21 under various operating conditions.

Referring now to FIGS. 20-22, FIG. 22 is a graph 2200 of current density output from further modified OPV cell 2000 of FIGS. 20 and 21 versus internal bias voltage under various conditions of light and E-field-generating voltages applied across bias ITO layer 1804 and second aluminum layer 2008, showing data acquired during the experiment. The power generated by OPV cell 2000 is in the fourth quadrant 2204, so that the lower the curve is in the fourth quadrant, the greater the performance of the OPV cell. For clarity: curve 2208 depicts the case in which no light is impinging upon OPV cell 2000; curve 2212 depicts the case in which no electrical bias is applied across bias ITO layer 1804 and second aluminum layer 2008 and light is impinging on the OPV cell; curve 2216 depicts the case in which a +100 V bias is applied across the bias ITO layer and the second aluminum layer and light is impinging on the OPV cell; curve 2220 depicts the case in which a +500 V bias is applied across the bias ITO layer and the second aluminum layer and light is impinging on the OPV cell; and curve 2224 depicts the case in which a +1000 V bias is applied across the bias ITO layer and the second aluminum layer and light is impinging on the OPV cell. At 1000 V of back bias, there was some increase in short circuit current, Jsc, and open circuit voltage, Voc, change, although this is minimal. Care was taken to calibrate the light source (not shown) and to not heat up OPV cell 2000 during subsequent photo illumination and back bias application.

Figure 23:
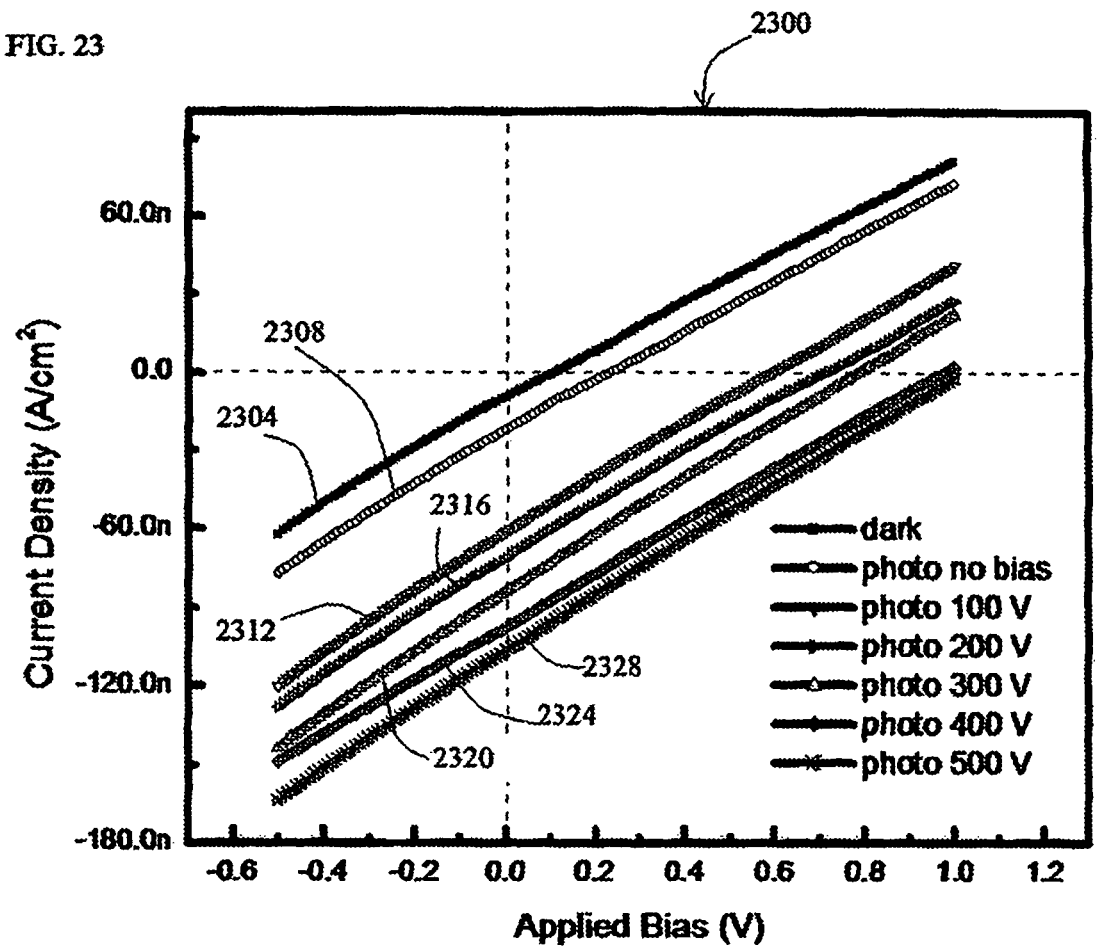
FIG. 23 is a graph of experimental data for current density versus internal applied bias for a positive bias applied to a third variant of an OPV cell in which both the cathode and anode contacts of the cell have patterned openings.
Figure 24:
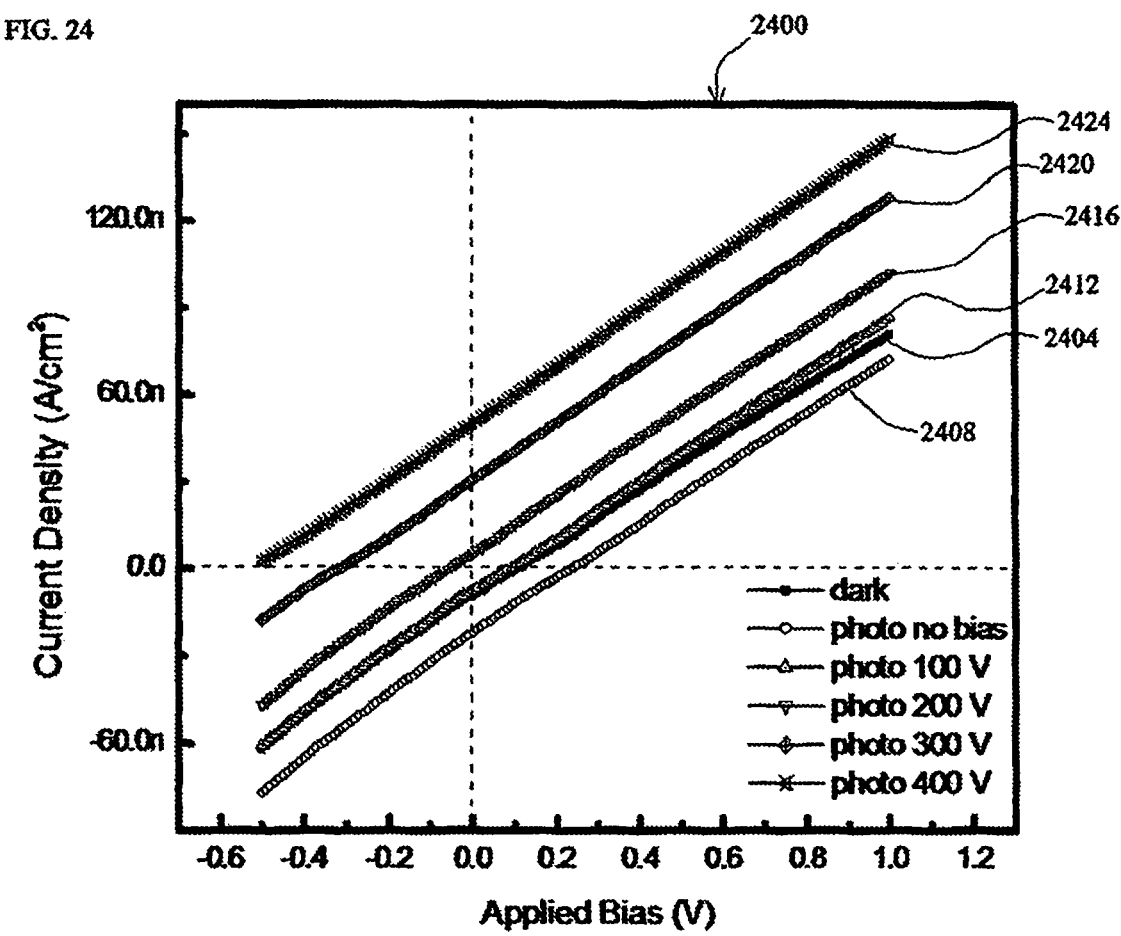
FIG. 24 is a graph of experimental data for current density versus internal applied bias for a negative bias applied to the third variant in which both the cathode and anode contacts of the cell have patterned openings.

After experimenting with OPV cell 2000 (FIGS. 20 and 21) having patterned aluminum contact layer 2004, a third variant (not shown) was built. This variant was similar to OPV cell 2000, except that instead of just aluminum contact layer 2004 having openings 2100 (FIG. 21), both the aluminum contact layer (corresponding to layer 2004 in FIG. 20) and the contact ITO layer (corresponding to layer 1712) were patterned with openings. FIGS. 23 and 24 are graphs 2300, 2400 of current density versus internal bias voltage under various conditions of light and E-field-generating voltages for, respectively, positive bias and negative bias.

For clarity relative to graph 2300 of FIG. 23: curve 2304 depicts the case in which no light is impinging upon the OPV cell; curve 2308 depicts the case in which no electrical bias is applied across the bias ITO layer and the second aluminum layer and light is impinging on the OPV cell; curve 2312 depicts the case in which a +100 V bias is applied across the bias ITO layer and the second aluminum layer and light is impinging on the OPV cell; curve 2316 depicts the case in which a +200 V bias is applied across the bias ITO layer and the second aluminum layer and light is impinging on the OPV cell; curve 2320 depicts the case in which a +300 V bias is applied across the bias ITO layer and the second aluminum layer and light is impinging on the OPV cell; curve 2324 depicts the case in which a +400 V bias is applied across the bias ITO layer and the second aluminum layer and light is impinging on the OPV cell; and curve 2328 depicts the case in which a +500 V bias is applied across the bias ITO layer and the second aluminum layer and light is impinging on the OPV cell.

Similarly, for clarity relative to graph 2400 of FIG. 24: curve 2404 depicts the case in which no light is impinging upon the OPV cell; curve 2408 depicts the case in which no electrical bias is applied across the bias ITO layer and the second aluminum layer and light is impinging on the OPV cell; curve 2412 depicts the case in which a −100 V bias is applied across the bias ITO layer and the second aluminum layer and light is impinging on the OPV cell; curve 2416 depicts the case in which a −200 V bias is applied across the bias ITO layer and the second aluminum layer and light is impinging on the OPV cell; curve 2420 depicts the case in which a −300 V bias is applied across the bias ITO layer and the second aluminum layer and light is impinging on the OPV cell; and curve 2424 depicts the case in which a −400 V bias is applied across the bias ITO layer and the second aluminum layer and light is impinging on the OPV cell.

As is evident from comparing graphs 2300, 2400 of FIGS. 23 and 24 with graphs 2200 and 1900 of FIGS. 22 and 19, patterning both contacts (i.e., the cathode and anode) of the OPV cell created the largest observable change under bias. This seems to suggest that the unpatterned contacts, or patterning only one contact, seems to limit the penetration of the applied E-field into the cell.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A device, comprising:
a functional semiconductor element providing, during use, at least one of 1) an electrical function and 2) an opto electrical function; and
a static-field source that produces a static electric field and includes at least one electret, said static-field source designed, configured and located in fixed relation relative to said functional semiconductor element so that said static electric field enhances carrier mobility within said functional semiconductor element;
wherein said functional semiconductor element has a first side and a second side spaced from said first side said static-field source including a mono-polar electret located on said first side and a grounded body located on said second side.

2. A device according to claim 1, further comprising a first electrode disposed over said first side of said functional semiconductor element, wherein said first electrode contains at least one E-field window that allows said static electric field to exist across said functional semiconductor element.

3. A device according to claim 2, wherein said at least one E-field window includes openings in said first electrode and said openings contain portions of said mono-polar electret.

4. A device according to claim 2, further comprising a second electrode disposed over said second side of said functional semiconductor element, wherein said second electrode contains at least one E-field window that allows said static electric field to exist across said functional semiconductor element, said second electrode being electrically insulated from said grounded body.

5. A device according to claim 1, further comprising charging circuitry in electrical communication with said at least one electret and designed and configured to periodically rejuvenate static electrical charge in said at least one electret.

6. A device according to claim 1, wherein said functional semiconductor element has a first side and a second side spaced from said first side, said static-field source including a first mono-polar electret located on said first side and a second mono-polar electret located on said second side, wherein said first and second mono-polar electrets are of opposite polarities.

7. A device according to claim 1, wherein said functional semiconductor element comprises a non-monocrystalline semiconductor body.

8. A device according to claim 7, wherein said non-monocrystalline semiconductor body is a single layer comprising a p-region and an n-region together forming a p-n junction.

9. A device according to claim 7, wherein said non-monocrystalline semiconductor body comprises a p-layer and an n-layer together forming a p-n junction.

10. A device according to claim 7, wherein said non-monocrystalline semiconductor body is a polycrystalline semiconductor body made of an inorganic semiconductor material.

11. A device according to claim 7, wherein said non-monocrystalline semiconductor body is made of an organic semiconductor material.

12. A device according to claim 1, wherein said functional semiconductor element is a photovoltaic cell.

13. A device according to claim 1, wherein said functional semiconductor element is a light-emitting diode.

14. A device, comprising:
a functional semiconductor element that includes a donor material, an acceptor material, and a carrier-depletion region formed within said donor and acceptor materials and having a width, said functional semiconductor element providing, during use, at least one of 1) an electrical function and 2) an optoelectrical function; and
a static-field source that produces a static electric field, said electric field source located in fixed relation relative to said functional semiconductor element so as to control said width of said depletion region;
wherein said functional semiconductor element second side spaced from said first side, said static-field source including a mono-polar electret located on said first side and a grounded body located on said second side.

15. A device according to claim 14, further comprising a first electrode disposed over said first side of said functional semiconductor element, wherein said first electrode contains at least one E-field window that allows said static electric field to exist across said functional semiconductor element.

16. A device according to claim 15, wherein said at least one E-field window includes openings in said first electrode and said openings contain portions of said mono-polar electret.

17. A device according to claim 15, further comprising a second electrode disposed over said second side of said functional semiconductor element, wherein said second electrode contains at least one E-field window that allows said static electric field to exist across said functional semiconductor element, said second electrode being electrically insulated from said grounded body.

18. A device according to claim 14, further comprising charging circuitry in electrical communication with said at least one electret and designed and configured to periodically rejuvenate static electrical charge in said at least one electret.

19. A device according to claim 14, wherein said functional semiconductor element has a first side and a second side spaced from said first side, said static-field source including a first mono-polar electret located on said first side and a second mono-polar electret located on said second side, wherein said first and second mono-polar electrets are of opposite polarities.

20. A device according to claim 14, wherein said functional semiconductor element comprises a non-monocrystalline semiconductor body, wherein said depletion region is contained in said non-monocrystalline semiconductor body.

21. A device according to claim 20, wherein said non-monocrystalline semiconductor body is a polycrystalline semiconductor body made of an inorganic semiconductor material.

22. A device according to claim 20, wherein said non-monocrystalline semiconductor body is made of an organic semiconductor material.

23. A device according to claim 14, wherein said functional semiconductor element is a photovoltaic cell.

24. A device according to claim 14, wherein said functional semiconductor element is a light-emitting diode.

25. A photovoltaic-cell device, comprising:
a photovoltaic cell that includes:
a semiconductor body containing donor and acceptor materials and having a first side and a second side spaced from said first side;
a first ohmic contact in electrical communication with said semiconductor body on said first side;
a second ohmic contact in electrical communication with said semiconductor body on said second side; and
an electrical-field source designed and configured to apply a static electric field across said semiconductor body, said electrical-field source including:
a first electret located on said first side of said semiconductor body; and
a second electret located on said second side of said semiconductor body;
wherein each of said first and second ohmic contacts is designed and configured to allow said static electric field to be present across said semiconductor body.

26. A photovoltaic-cell device according to claim 25, wherein said semiconductor body comprises a non-monocrystalline semiconductor material.

27. A photovoltaic-cell device according to claim 26, wherein said non-monocrystalline semiconductor material is an organic semiconductor material.

28. A photovoltaic-cell device according to claim 25, wherein said semiconductor body contains a charge-depletion region having a width, and said static electric field has a strength selected as a function of said width.

29. A photovoltaic-cell device according to claim 25, further comprising charging circuitry designed and configured to periodically rejuvenate electrical charge of said electrical-field source.

30. A method of enhancing performance of a functional semiconductor element, comprising:
providing the functional semiconductor element; and
locating an electret-based electric field source proximate the functional semiconductor element so as to immerse said functional semiconductor element in a static electric field from the electret-based electric field source so as to enhance performance of the functional semiconductor element;
wherein said providing the functional semiconductor element includes providing a solar cell.

31. A method according to claim 30, wherein said providing the solar cell includes providing an organic-semiconductor-based solar cell.

32. A method according to claim 30, wherein said providing the solar cell includes providing an inorganic-semiconductor-based solar cell.

33. A method according to claim 30, wherein the functional semiconductor element is formed in a body having first and second side spaced from one another and said locating the electret-based electric field source proximate the functional semiconductor element includes locating a first electret on the first side of the body.

34. A method according to claim 30, further including providing charging circuitry designed and configured to periodically recharge the electret-based electric field source.

35. A method of enhancing performance of a functional semiconductor element, comprising:
providing the functional semiconductor element; and
locating an electret-based electric field source proximate the functional semiconductor element so as to immerse said functional semiconductor element in a static electric field from the electret-based electric field source so as to enhance performance of the functional semiconductor element;
wherein said providing the functional semiconductor element includes providing a light-emitting diode.

36. A method according to claim 35, further including providing charging circuitry designed and configured to periodically recharge the electret-based electric field source.

37. A method of modulating the width of a depletion region in a functional semiconductor element, comprising:
providing the functional semiconductor element having the depletion region straddling a junction between a p-type semiconductor material and an n-type semiconductor material; and
immersing the functional semiconductor element in a static electric field for the purpose of modulating the width of the depletion region;
wherein:
the functional semiconductor element is formed in a body having first and second spaced from one another on opposing sides of the junction, and said immersing the functional semiconductor element in the static electric field includes locating a first electret proximate the functional. semiconductor element on the first side of the functional semiconductor element; and
said immersing the functional semiconductor element in the static electric field includes locating a second electret proximate the functional semiconductor element on the second side of the functional semiconductor element.

38. A method of modulating the width of a depletion region in a functional semiconductor element, comprising:
providing the functional semiconductor element having the depletion region straddling a junction between a p-type semiconductor material and an n-type semiconductor material: and
immersing the functional semiconductor element in a static electric field for the purposeof modulating the width of the depletion region;
wherein said providing the functional semiconductor element includes providing a solar cell.

39. A method of modulating the width of a depletion region in a functional semiconductor element, comprising:
providing the functional semiconductor element having the depletion region straddling a junction between a p-type semiconductor material and an n-type semiconductor material: and
immersin the functional semiconductor element in a static electric field for the purpose of modulating the width of the depletion region;
wherein said providing the functional semiconductor element includes providing a light-emitting diode.

* * * * *